(12) United States Patent
Tak et al.

(10) Patent No.: US 7,288,790 B2
(45) Date of Patent: Oct. 30, 2007

(54) THIN FILM TRANSISTOR ARRAY PANEL AND MANUFACTURING METHOD THEREOF

(75) Inventors: Young-Mi Tak, Seoul (KR); Seung-Soo Baek, Suwon (KR); Joo-Ae Youn, Seongnam (KR); Dong-Gyu Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/612,055

(22) Filed: Dec. 18, 2006

(65) Prior Publication Data

US 2007/0090367 A1    Apr. 26, 2007

Related U.S. Application Data

(60) Continuation of application No. 11/516,187, filed on Sep. 6, 2006, which is a division of application No. 10/718,309, filed on Nov. 20, 2003, now Pat. No. 7,138,655.

(30) Foreign Application Priority Data

Nov. 20, 2002    (KR) .......................... 2002-0072288

(51) Int. Cl.
  $H01L\ 29/04$  (2006.01)
  $H01L\ 31/20$  (2006.01)
  $H01L\ 31/036$ (2006.01)
  $H01L\ 31/0376$ (2006.01)
(52) U.S. Cl. .......................... 257/59; 257/72; 257/347
(58) Field of Classification Search ................. 257/59, 257/72, 347, 350–353, E29.117, E29.273
See application file for complete search history.

(56) References Cited

U.S. PATENT DOCUMENTS 5,097,297 A    3/1992   Nakazawa
5,808,317 A    9/1998   Kuo (Continued)

FOREIGN PATENT DOCUMENTS

| CN | 1165568 A | 11/1997 |
|---|---|---|
| JP | 06-258667 | 9/1994 |
| KR | 1994-0012665 | 6/1994 |
| KR | 1995-0003899 | 2/1995 |
| KR | 1020020042924 | 6/2002 |

OTHER PUBLICATIONS

Abstract of corresponding application US5930607 for CN1165568.

*Primary Examiner*—Hoai Pham
(74) *Attorney, Agent, or Firm*—F. Chau & Assoc. LLC

(57) ABSTRACT

A TFT array panel includes: first and second gate members connected to each other; a gate insulating layer formed on the first and the second gate members; first and second semiconductor members formed on the gate insulating layer opposite the first and the second gate members, respectively; first and second source members connected to each other and located near the first and the second semiconductor members, respectively; first and second drain members located near the first and the second semiconductor members, respectively, and located opposite the first and the second source members with respect to the first and the second gate members, respectively; and a pixel electrode connected to the first and the second drain members. The first gate, semiconductor, source, and drain members form a first TFT, and the second gate, semiconductor, source, and drain members form a second TFT.

16 Claims, 30 Drawing Sheets

U.S. PATENT DOCUMENTS

| | | |
|---|---|---|
| 6,144,082 A | 11/2000 | Yamazaki et al. |
| 6,331,723 B1 | 12/2001 | Yamazaki et al. |
| 6,670,637 B2 * | 12/2003 | Yamazaki et al. ............ 257/59 |
| 6,969,889 B2 | 11/2005 | Cho et al. |

* cited by examiner

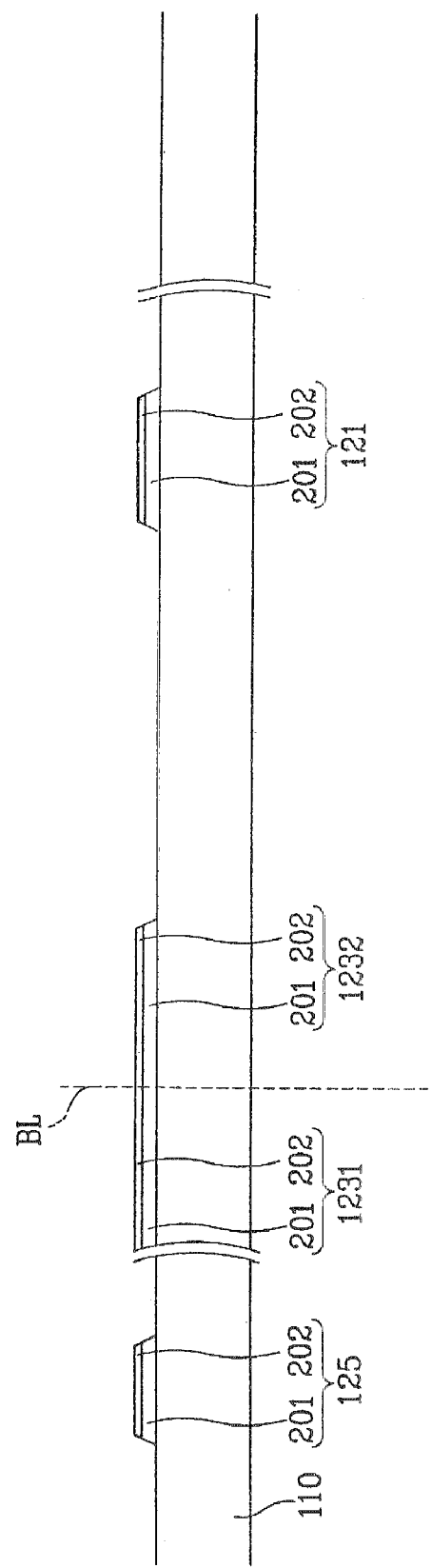

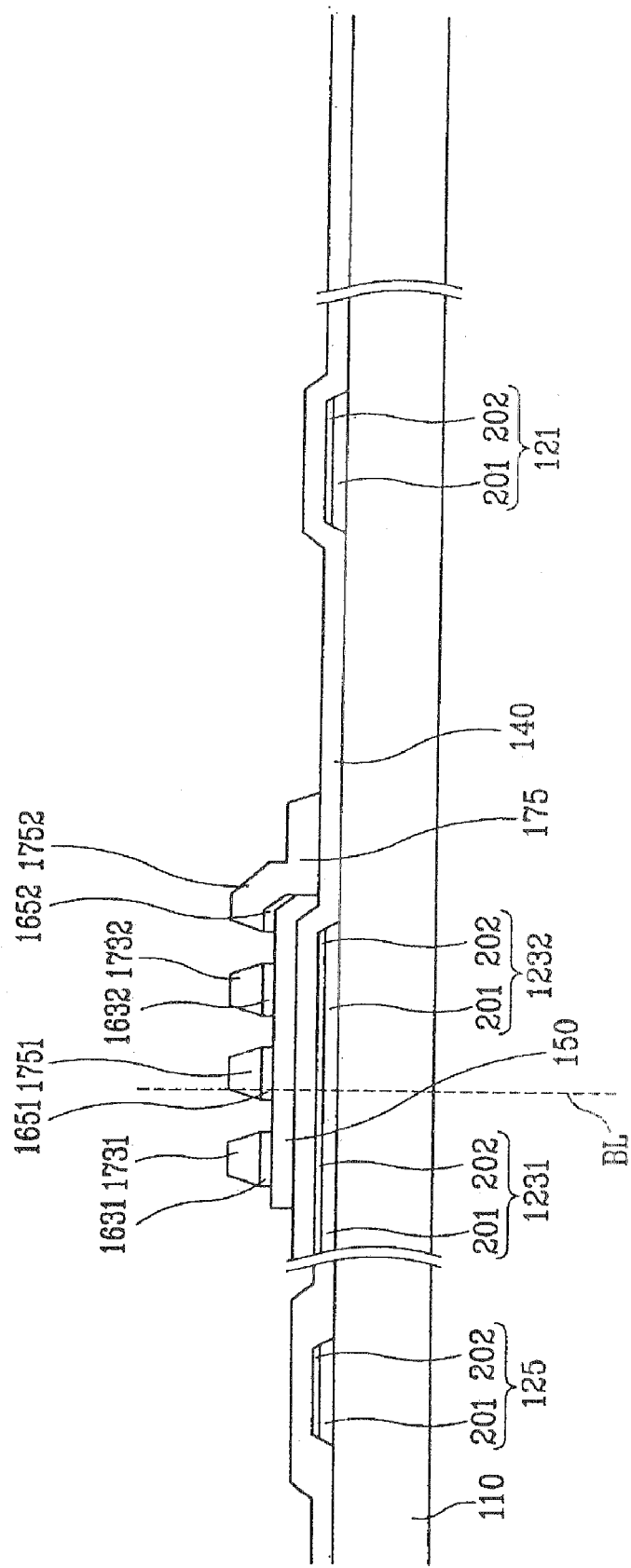

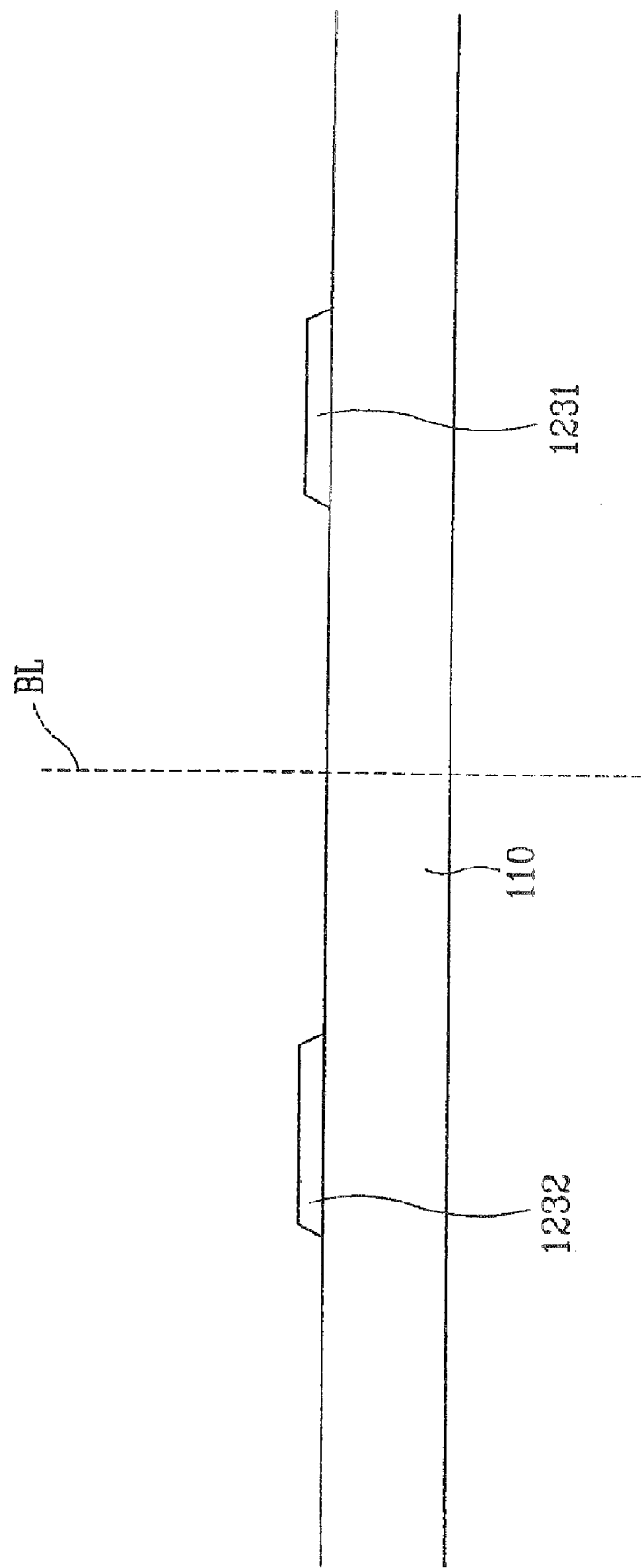

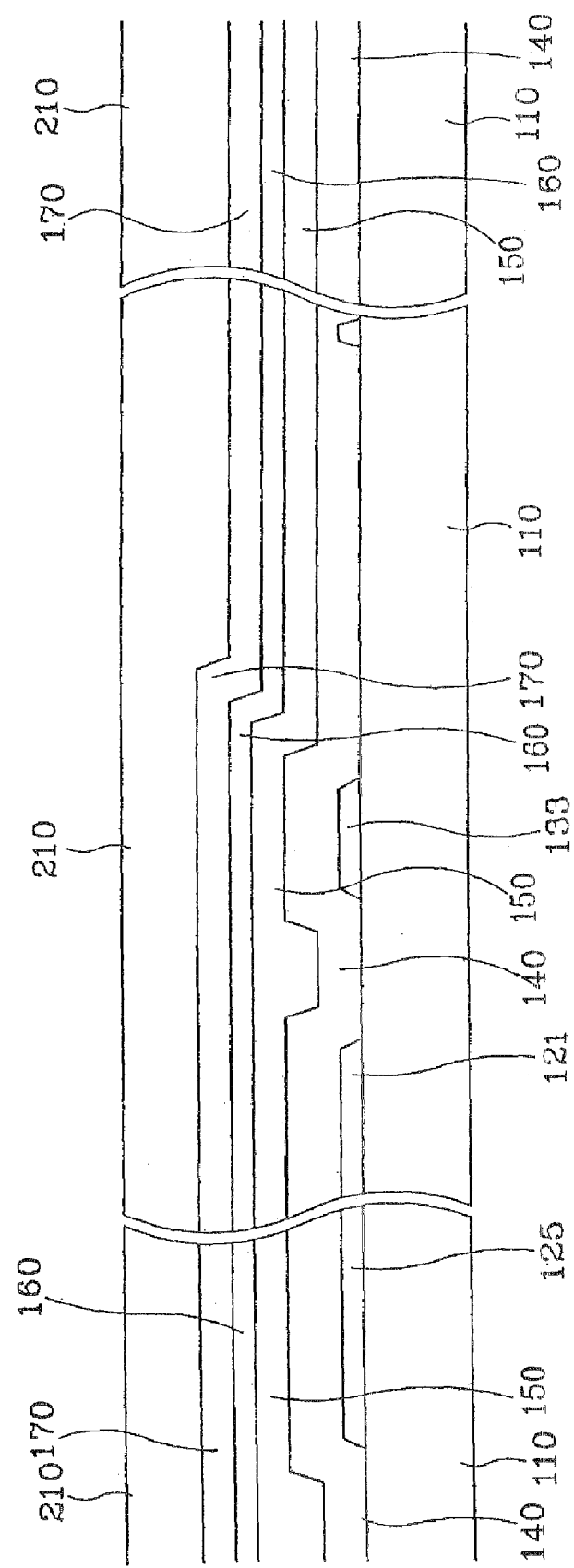

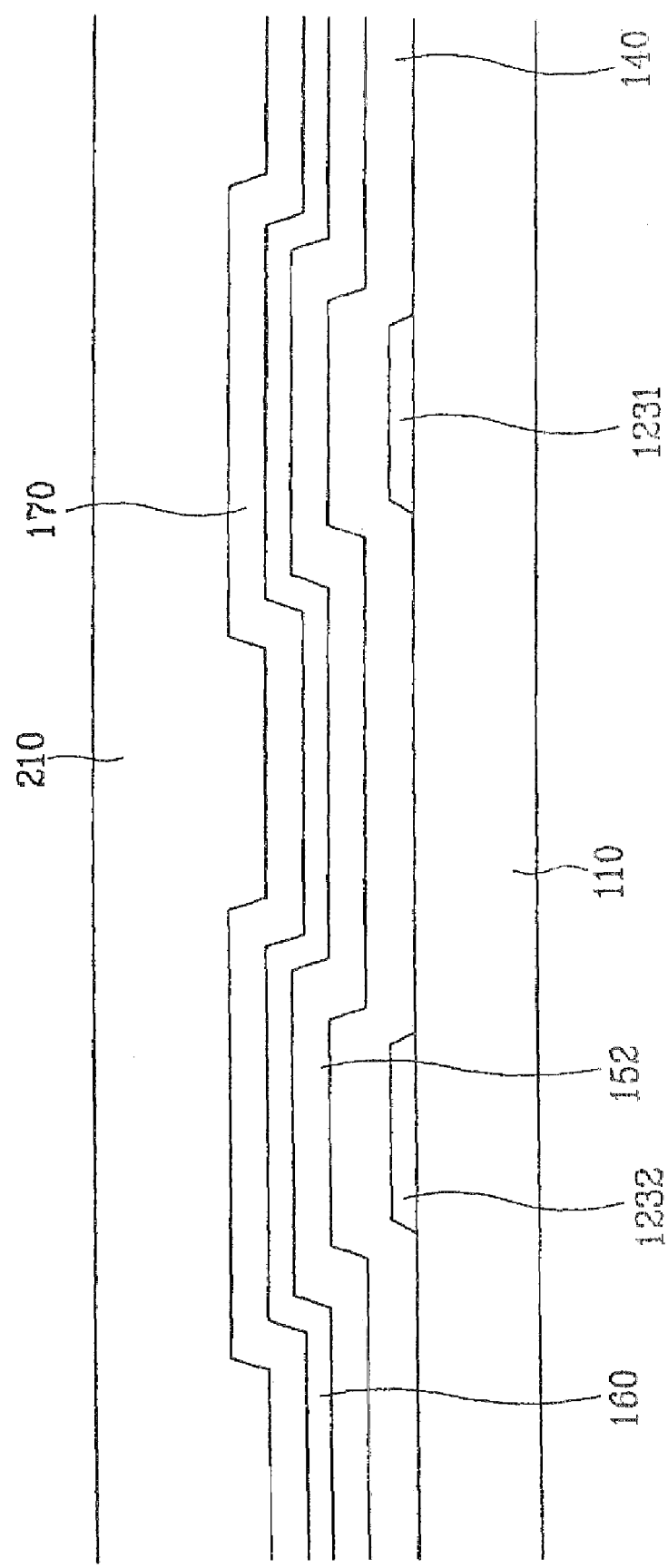

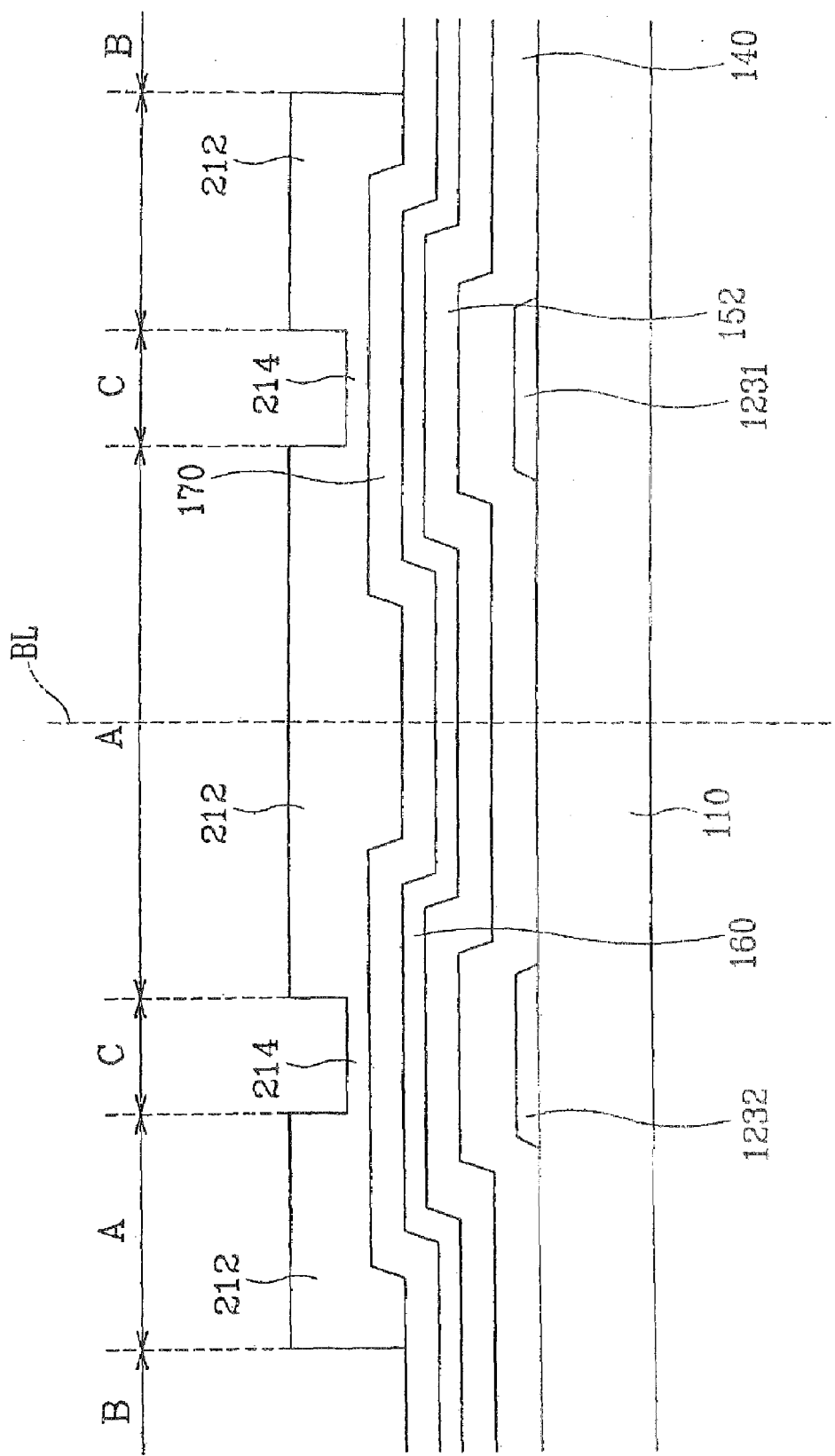

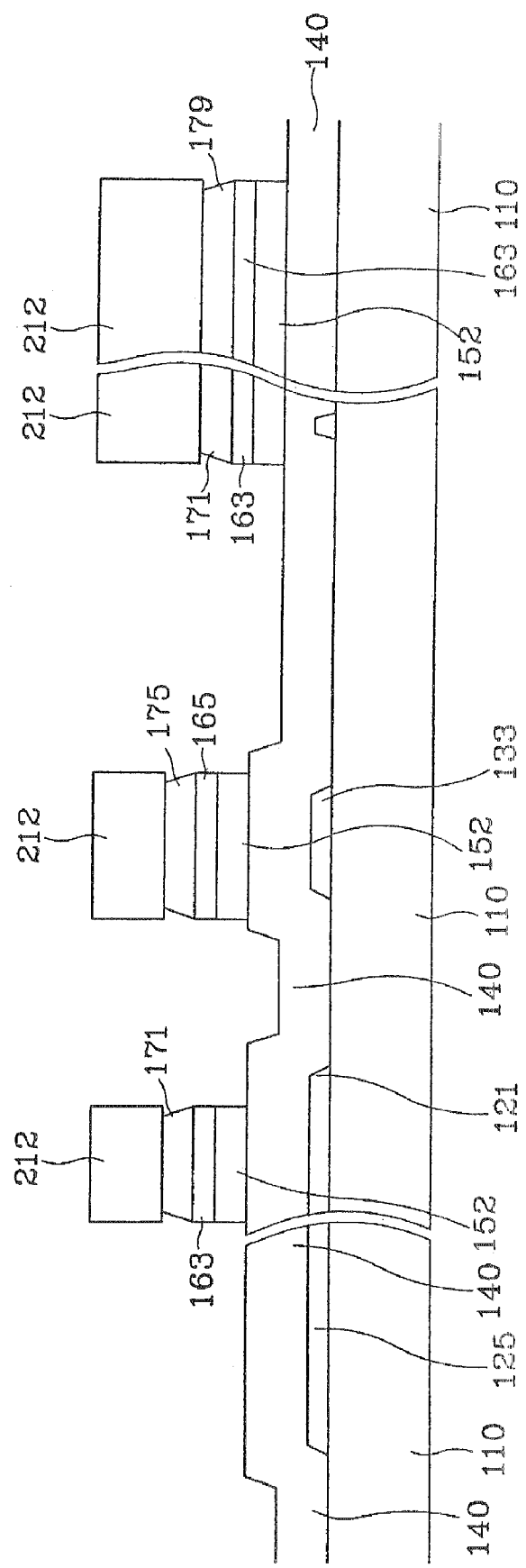

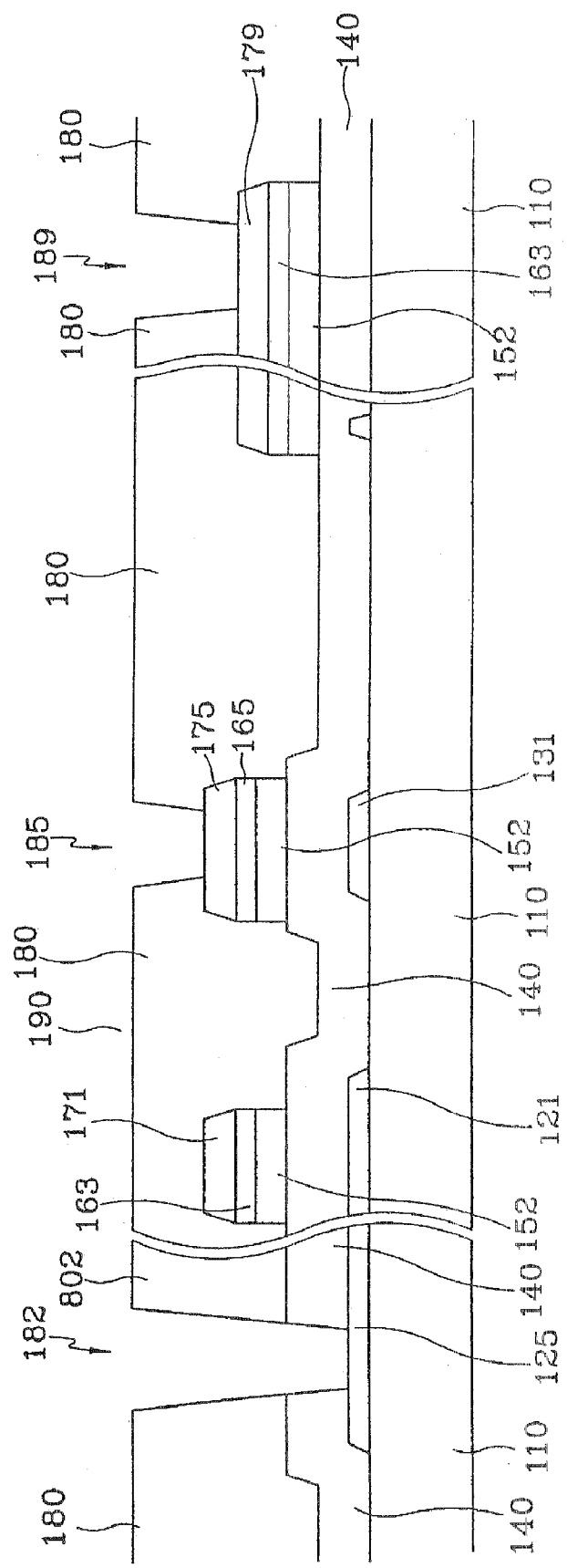

THIN FILM TRANSISTOR ARRAY PANEL AND MANUFACTURING METHOD THEREOF

CROSS REFERENCE TO RELATED APPLICATION'S

This application is a Continuation of U.S. patent application Ser. No. 11/516,187 filed on Sep. 6, 2006 which is a Divisional of U.S. patent application Ser. No. 10/718,309 filed on Nov. 20, 2003, now U.S. Pat. No. 7,138,655, and which claims priority to Korean Patent Application No. 2002-72288, filed Nov. 20, 2002 in the Korean Intellectual Property Office (KIPO), all of which are fully incorporated herein by reference.

BACKGROUND OF THE INVENTION (a) Field of the Invention

The present invention relates to a thin film transistor array panel and a manufacturing method thereof.

(b) Description of the Related Art

Generally, a liquid crystal display (LCD) is one of the most widely used flat panel displays. The LCD has two panels provided with electrodes formed thereon and a liquid crystal layer interposed between the two panels. Voltages are applied to the electrodes to reorient liquid crystal molecules in the liquid crystal layer, thereby controlling the transmittance of light.

The electrodes are supplied with the voltages through switching elements called thin film transistors (TFTs). The TFTs are required to have high current driving capacity as the LCD becomes large, and it is preferable that channel width of the TFTs are increased.

In the meantime, photo-etching processes are performed to form various patterns on the panels of the LCD through light exposure.

When a backplane for LCDs is too large to use an exposure mask, the entire exposure is accomplished by repeating a divisional exposure called step-and-repeat process. One divisional exposure unit or area is called a shot. Since transition, rotation, distortion, and etc. are generated during light exposure, the shots are not aligned accurately. Accordingly, parasitic capacitances generated between wires and pixel electrodes differ depending on the shots, and this causes the bright difference between the shots, which is recognized at the pixels located at a boundary between the shots. Therefore, the stitch defect is generated on the screen of the LCD due to brightness discontinuity between the shots.

SUMMARY OF THE INVENTION

A thin film transistor array panel is provided, which includes: first and second gate members connected to each other; a gate insulating layer formed on the first and the second gate members; first and second semiconductor members formed on the gate insulating layer opposite the first and the second gate members, respectively; first and second source members connected to each other and located near the first and the second semiconductor members, respectively; first and second drain members located near the first and the second semiconductor members, respectively, and located opposite the first and the second source members with respect to the first and the second gate members, respectively; and a pixel electrode connected to the first and the second drain members, wherein the first gate member, the first semiconductor member, the first source member, and the first drain members form a first thin film transistor, and the second gate member, the second semiconductor member, the second source member, and the second drain members form a second thin film transistor.

Preferably, the first thin film transistor and the second thin film transistor are symmetrically aligned, particularly with respect to a predetermined line such as a boundary line between shots in light exposure.

The thin film transistor array panel may further include a third thin film transistor different from the first and the second thin film transistors.

The alignment of the first and the second, thin film transistors are located opposite each other with respect to a boundary line between shots in light exposure.

Channels of the first and the second thin film transistors have curved shapes, preferably U or C shapes.

The first and the second semiconductor members may have substantially the same planar shapes as the first and the second source and drain members except for channel portions of the first and the second thin film transistors.

A method of manufacturing a thin film transistor array panel is provided, which includes; forming a pair of first and second gate members; forming a gate insulating layer on the first and the second gate members; forming a pair of first and second semiconductor members on the gate insulating layer; forming a pair of first and second source members and a pair of first and second drain members; and forming a pixel electrode connected to the first and the second drain members, wherein at least one pair of the first and the second gate members, the first and the second semiconductor members, the first and the second source members, and the first and the second drain members are formed using a divisional light exposure, and a boundary line between shots in the divisional light exposure is located between the first gate member and the second gate member, between the first semiconductor member and the second semiconductor member, between the first source member and the second source member, or between the first drain member and the second drain member.

The at least one pair has a shape symmetrical with respect to the boundary line.

BRIEF DESCRIPTION OF THE DRAWINGS

The present invention will become more apparent by describing embodiments thereof in detail with reference to the accompanying drawings in which:

FIGS. 3B, 4B, 5B and 6B are sectional views of the TFT array panel shown in FIGS. 3A, 4A, 5A and 6A taken along the lines IIIB-IIIB', IVB-IVB', VB-VB' and VIB-VIB', respectively;

FIGS. 10B and 10C are sectional views of the TFT array panel shown in FIG. 10A taken along the lines XB-XB' and XC-XC', respectively;

FIGS. 11A and 11B are sectional views of the TFT array panel shown in FIG. 10A taken along the lines XB-XB' and XC-XC', respectively, and illustrate the step following the step shown in FIGS. 10B and 10C;

FIGS. 12B and 12C are sectional views of the TFT array panel shown in FIG. 12A taken along the lines XIIB-XIIB' and XIIC-XIIC', respectively;

FIGS. 13A, 14A and 15A, and FIGS. 13B, 14B and 15B are respective sectional views of the TFT array panel shown in FIG. 12A taken along the lines XIIB-XIIB' and XIIC-XIIC', respectively, and illustrate the steps following the step shown in FIGS. 12B and 12C;

FIGS. 16B and 16C are sectional views of the TFT array panel shown in FIG. 16A taken along the lines XVIB-XVIB' and XVIC-XVIC', respectively;

DETAILED DESCRIPTION OF EMBODIMENTS

Figure 1:
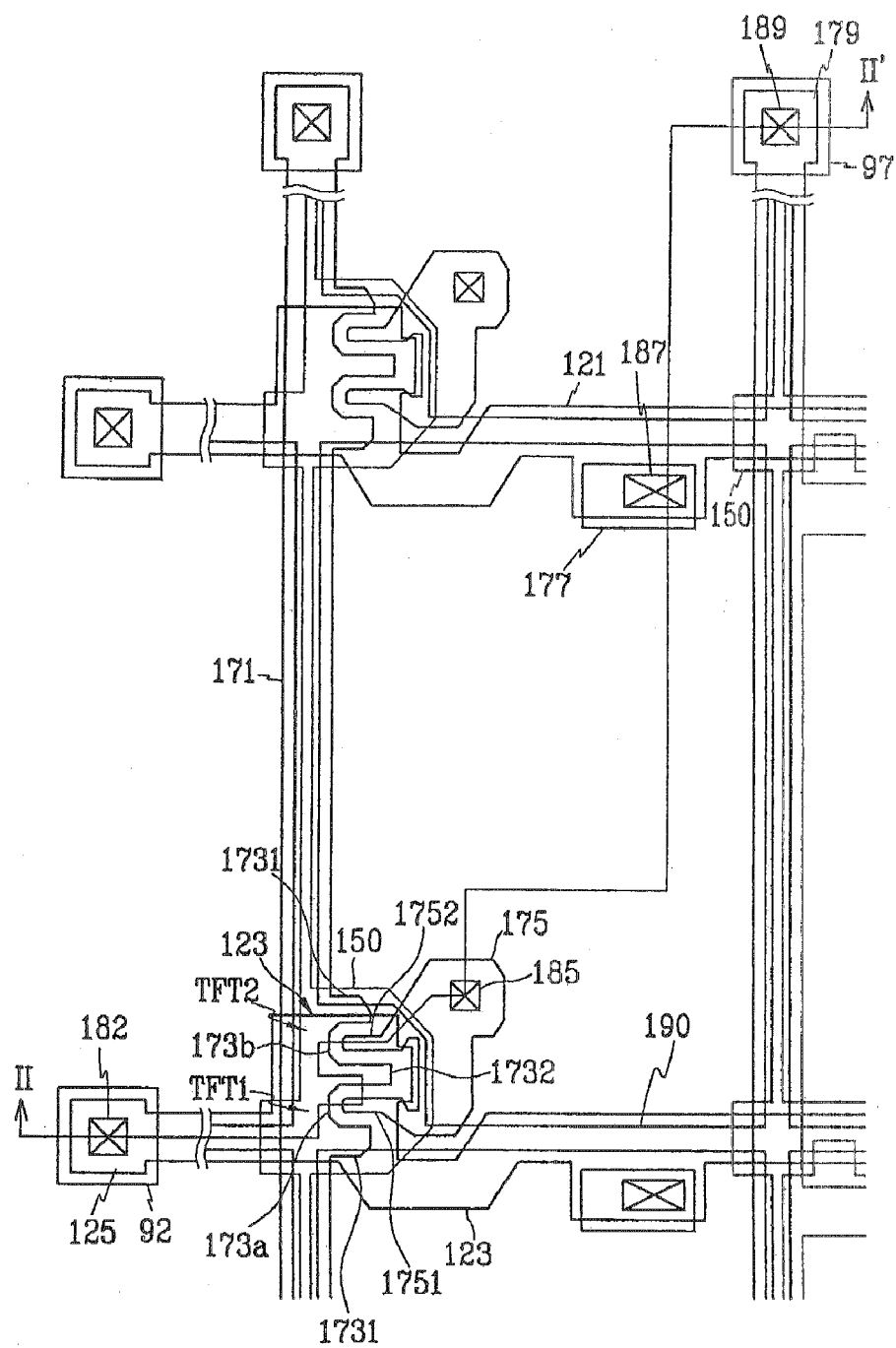
FIG. 1 is a layout view of an exemplary TFT array panel for an LCD according to an embodiment of the present invention.

The present invention now will be described more fully hereinafter with reference to the accompanying drawings, in which preferred embodiments of the invention are shown. The present invention may, however, the embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

First, a TFT array panel for an LCD according to an embodiment of the present invention is described in detail with reference to FIGS. 1 and 2.

Figure 2:
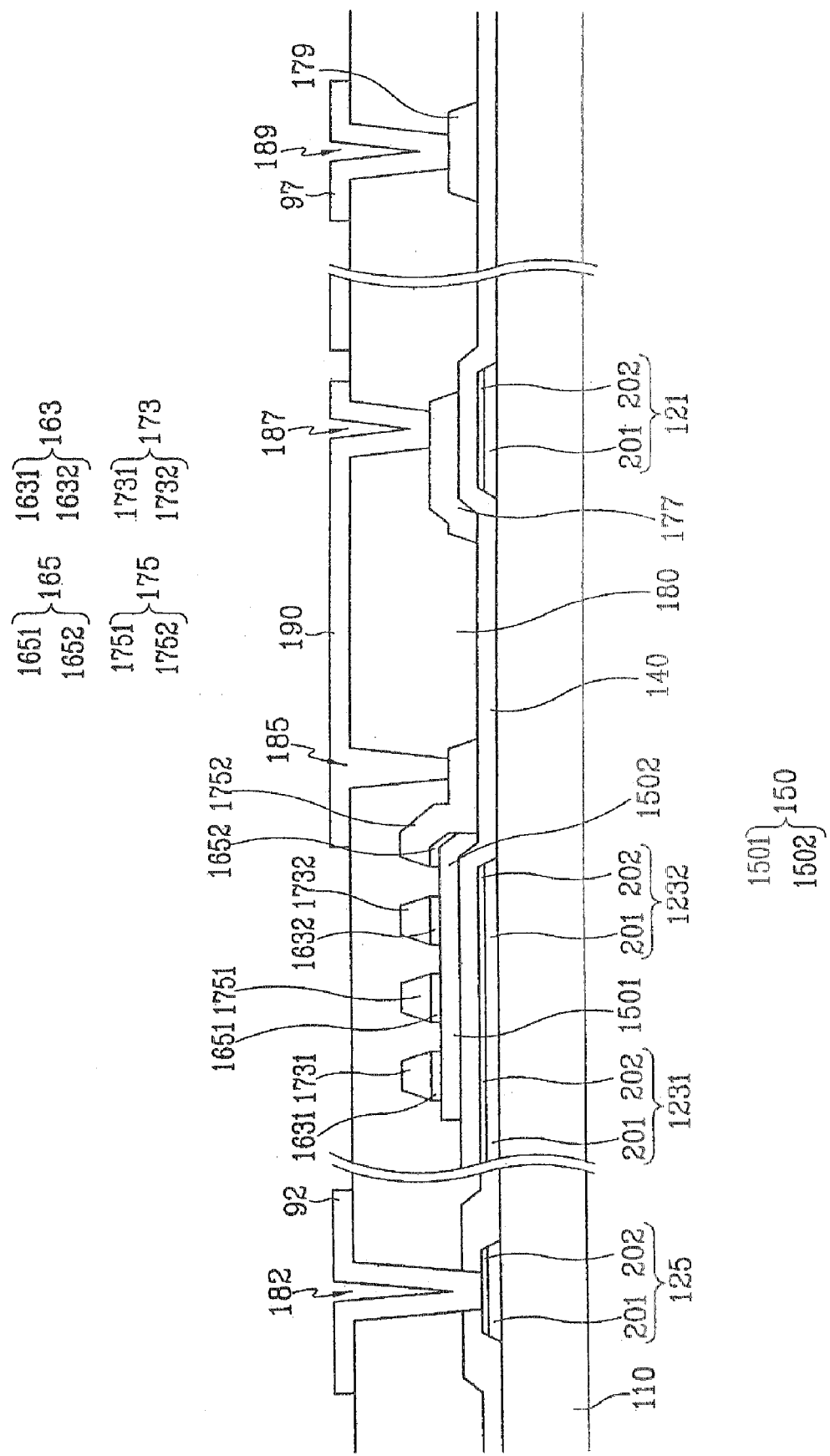
FIG. 2 is a sectional view of the TFT array panel shown in FIG. 1 taken along the line II-II'.

FIG. 1 is a layout view of an exemplary TFT array panel for an LCD according to an embodiment of the present invention, and FIG. 2 is a sectional view of the TFT array panel shown in FIG. 1 taken along the line II-II'.

A plurality of gate lines 121 for transmitting gate signals are formed on an insulating substrate 110. Each gate line 121 extends substantially in a transverse direction and a plurality of upwardly protruding portions of each gate line 121 form a plurality of gate electrodes 123. The gate electrodes 123 include two gate members 1231 and 1232. Each gate line 121 includes a plurality of expansions protruding downward.

The gate lines 121 include two films having different physical characteristics, a lower film 201 and an upper film 202. The upper film 202 is preferably made of low resistivity metal including Al containing metal such as Al and Al alloy for reducing signal delay or voltage drop in the gate lines 121. On the other hand, the lower film 201 is preferably made of material such as Cr, Mo and Mo alloy having good contact characteristics with other materials such as ITO (inidium tin oxide) or IZO (indium zinc oxide). A good exemplary combination of the lower film material and the upper film material is Cr and Al-Nd alloy.

The lateral sides of the upper film 202 and the lower film 201 are tapered, and the inclination angle of the lateral sides with respect to a surface of the substrate 110 ranges about 30-80 degrees.

A gate insulating layer 140 preferably made of silicon nitride (SiNx) is formed on the gate lines 121.

A plurality of semiconductor stripes 150 preferably made of hydrogenated amorphous silicon (abbreviated to "a-Si") are formed on the gate insulating layer 140. Each semiconductor stripe 150 extends substantially in a longitudinal direction and has a plurality of projections branched out toward the gate electrodes 123. Each semiconductor stripe 150 includes two semiconductor members 1501 and 1502. The width of each semiconductor stripe 150 becomes large near the gate lines 121 that the semiconductor stripe 150 covers large areas of the gate lines 121.

A plurality of ohmic contact stripes and islands 163 and 165 preferably made of silicide or n+ hydrogenated a-Si heavily doped with n type impurity are formed on the semiconductor stripes 150. Each ohmic contact stripe 163 has a plurality of projections, and the projections and the ohmic contact islands 165 are located in pairs on the projections of the semiconductor stripes 150.

The lateral sides of semiconductor stripes 150 and the ohmic contacts 163 and 165 are tapered, and the inclination angles thereof are preferably in a range between about 30-80 degrees.

A plurality of data lines 171, a plurality of drain electrodes 175, and a plurality of storage capacitor conductors 177 are formed on the ohmic contacts 163 and 165 and the gate insulating layer 140.

The data lines 171 for transmitting data voltages extend substantially in the longitudinal direction and intersect the gate lines 121. A plurality of branches 1731 and 1732 of each data line 171, which project toward the drain electrodes 175, form a plurality of source electrodes 173. Each drain electrode 175 has two drain members 1751 and 1752 extending parallel to each other in the transverse direction and is located on the gate electrode 123, and each source electrode 173 has three branches 1731 and 1732 forming two source members 173a and 173b having a semicircle shape partly surrounding the respective drain members 1751 and 1752 of the drain electrode 175. The branches 1731 and 1732 extend substantially parallel to the drain members 1751 and 1752 in the transverse direction. The source members 173a and 173b of a source electrode 173, the drain members 1751 and 1752 of a drain electrode 175, the gate members 1231 and 1232 of a gate electrode 123 located therebetween along with the semiconductor members 1501 and 1502 of a semiconductor stripe 150 and portions 1631, 1632, 1651 and 1652 form twin TFTs TFT1 and TFT2 connected in parallel. The planar shape of the twin TFTs TFT1 and TFT2 are symmetrical to the middle branch 1732 of the source electrode 173. Since twin transistors TFT1 and TFT2 have U shaped channels, their channels widths are increased such that they have high current driving capacity.

The storage capacitor conductors 177 overlap the expansions of the gate lines 121.

The data lines 171, the drain electrodes 175, and the storage capacitor conductors 177 include a conductive film preferably made of Mo, Mo alloy, Cr, Al, Al alloy, Al or Al alloy. However, they may have triple-layered structure including (1) Mo or Mo ally, (2) Al, and (3) Mo or Mo alloy.

Like the gate lines 121, the data lines 171, the drain electrodes 175, and the storage capacitor conductors 177 have tapered lateral sides, and inclination angles thereof range about 30-80 degrees.

The ohmic contacts 163 and 165 are interposed only between the underlying semiconductor stripes 150 and the overlying data lines 171 and the overlying drain electrodes 175 thereon and reduce the contact resistance therebetween. The semiconductor stripes 150 include a plurality of exposed portions, which are not covered with the data lines 171 and the drain electrodes 175, such as portions located between the source electrodes 173 and the drain electrodes 175. Although the semiconductor stripes 150 are narrower than the data lines 171 at most places, the width of the semiconductor stripes 150 becomes large near the gate lines as described above, to enhance the insulation between the gate lines 121 and the data lines 171.

A passivation layer 180 is formed on the data lines 171, the drain electrodes 175, the storage conductors 177, and the exposed portions of the semiconductor stripes 150. The passivation layer 180 is preferably made of photosensitive organic material having a good flatness characteristic, low dielectric insulating material such as a-Si:C:O and a-Si:OF formed by plasma enhanced chemical vapor deposition (PECVD), or inorganic material such as silicon nitride. The passivation layer 180 may have a double-layered structure including an inorganic lower film and an organic upper film. In this case, the organic film is preferably removed from pad areas provided with end portions of the gate pads 125 and the data pads 179, and this configuration is specifically advantageous to a COG (chip on glass) type LCD including gate driving ICs and data driving ICs directly mounted on a TFT array panel.

The passivation layer 180 has a plurality of contact holes 185, 187 and 189 exposing the drain electrodes 175, the storage conductors 177, and end portions 179 of the data lines 171, respectively. The passivation layer 180 and the gate insulating layer 140 have a plurality of contact holes 182 exposing end portions 125 of the gate lines 121.

The contact holes 182, 185, 187 and 189 expose the gate lines 121, the data lines 171, the drain electrodes 175, and the storage capacitor conductors 177, respectively.

A plurality of pixel electrodes 190 and a plurality of contact assistants 92 and 97, which are preferably made of transparent conductive material such as ITO and IZO or reflective conductive material such as Al and Ag, are formed on the passivation layer 180.

The pixel electrodes 190 are physically and electrically connected to the drain electrodes 175 through the contact holes 185 and to the storage capacitor conductors 177 through the contact holes 47 such that the pixel electrodes 190 receive the data voltages from the drain electrodes 175 and transmit the received data voltages to the storage capacitor conductors 177. The pixel electrodes 190 supplied with the data voltages generate electric fields in cooperation with a common electrode (not shown) on an opposite panel (not shown), which reorient liquid crystal molecules in the liquid crystal layer disposed therebetween.

The pixel electrode 190 and the common electrode form a liquid crystal capacitor $C_{LC}$, which stores applied voltages after turn-off of the TFT Q. An additional capacitor called a "storage capacitor," which is connected in parallel to the liquid crystal capacitor $C_{LC}$, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the expansions at the gate lines 121 for increasing overlapping areas and by providing the storage capacitor conductors 177, which are connected to the pixel electrodes 190 and overlap the expansions, under the pixel electrodes 190 for decreasing the distance between the terminals.

The pixel electrodes 190 overlap the gate lines 121 and the data lines 171 to increase aperture ratio but it is optional.

The contact assistants 92 and 97 are connected to the exposed end portions 125 of the gate lines 121 and the exposed end portions 179 of the data lines 171 through the contact holes 182 and 189, respectively. The contact assistants 92 and 97 are not requisites but preferred to protect the exposed portions 125 and 179 and to complement the adhesiveness of the exposed portion 125 and 179 and external devices.

An LCD according to an embodiment of the present invention includes a TFT array panel shown in FIGS. 1 and 2, a common electrode panel (not shown) facing the TFT array panel with a predetermined gap, and a liquid crystal layer (not shown) filled in the gap between the TFT array panel and the common electrode panel.

The liquid crystal layer may be aligned in a twisted nematic (TN) mode where liquid crystal molecules in the liquid crystal layer are aligned parallel to surfaces of the panels and rotate along a direction normal to the surfaces of the panels in the absence of electric field. Alternatively, the liquid crystal layer may be aligned in a vertically aligned (VA) mode where the liquid crystal molecules are aligned vertical to the surfaces of the panels in the absence of electric field.

The LCD further includes one or two polarizers attached to the panels and it optionally includes one or more retardation films.

A method of manufacturing the TFT array panel shown in FIGS. 1 and 2 according to an embodiment of the present invention will be now described in detail with reference to FIGS. 3A to 6B as well as FIGS. 1 and 2.

FIGS. 3A, 4A, 5A and 6A are layout views of the TFT array panel shown in FIGS. 1 and 2 in intermediate steps of a manufacturing method thereof according to an embodiment of the present invention, and FIGS. 3B, 4B, 5B and 6B are sectional views of the TFT array panel shown in FIGS. 3A, 4A, 5A and 6A taken along the lines IIIB-IIIB', IVB-IVB', VB-VB' and VIB-VIB', respectively.

Figure 3A:
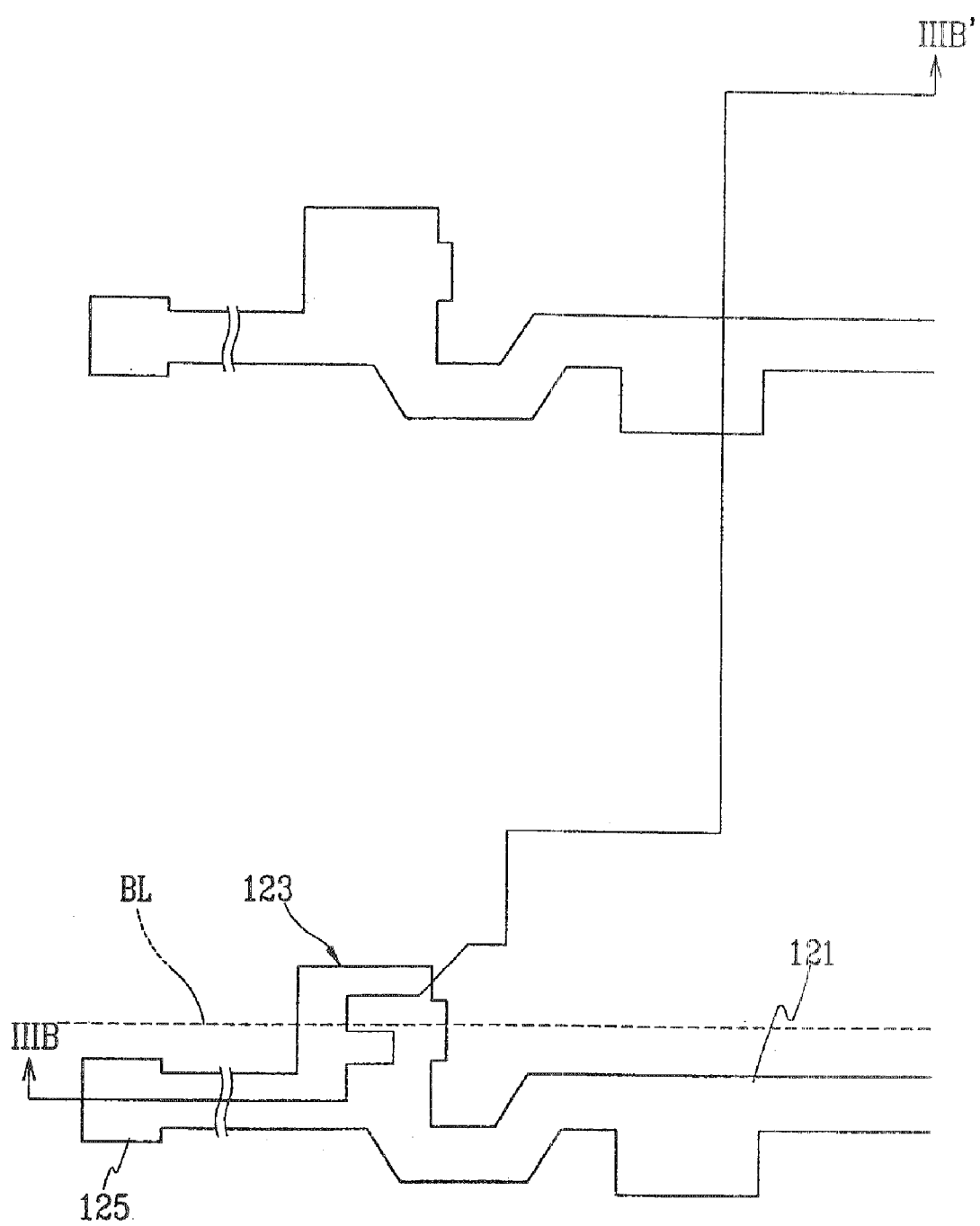
FIGS. 3A, 4A, 5A and 6A are layout views of the TFT array panel shown in FIGS. 1 and 2 in intermediate steps of a manufacturing method thereof according to an embodiment of the present invention.

Referring to FIGS. 3A and 3B, two conductive films, a lower conductive film 201 and an upper conductive film 202 are sputtered in sequence on an insulating substrate 110 such as transparent glass. The lower conductive film 201 is preferably made of Al, and preferably has a thickness of about 2000 Å-4,000 Å. The upper conductive film 202 is preferably made of Mo, Mo alloy and Cr, and preferably has a thickness of about 500 Å-2,000 Å.

The upper conductive film 202 and the lower conductive film 201 are patterned in sequence using step and repeat divisional photolithography to form a plurality of gate lines 121 including a plurality of gate electrodes 123 and a plurality of expansions. The boundary line BL of the shots in the divisional exposure extends substantially in a transverse direction.

Figure 4A:
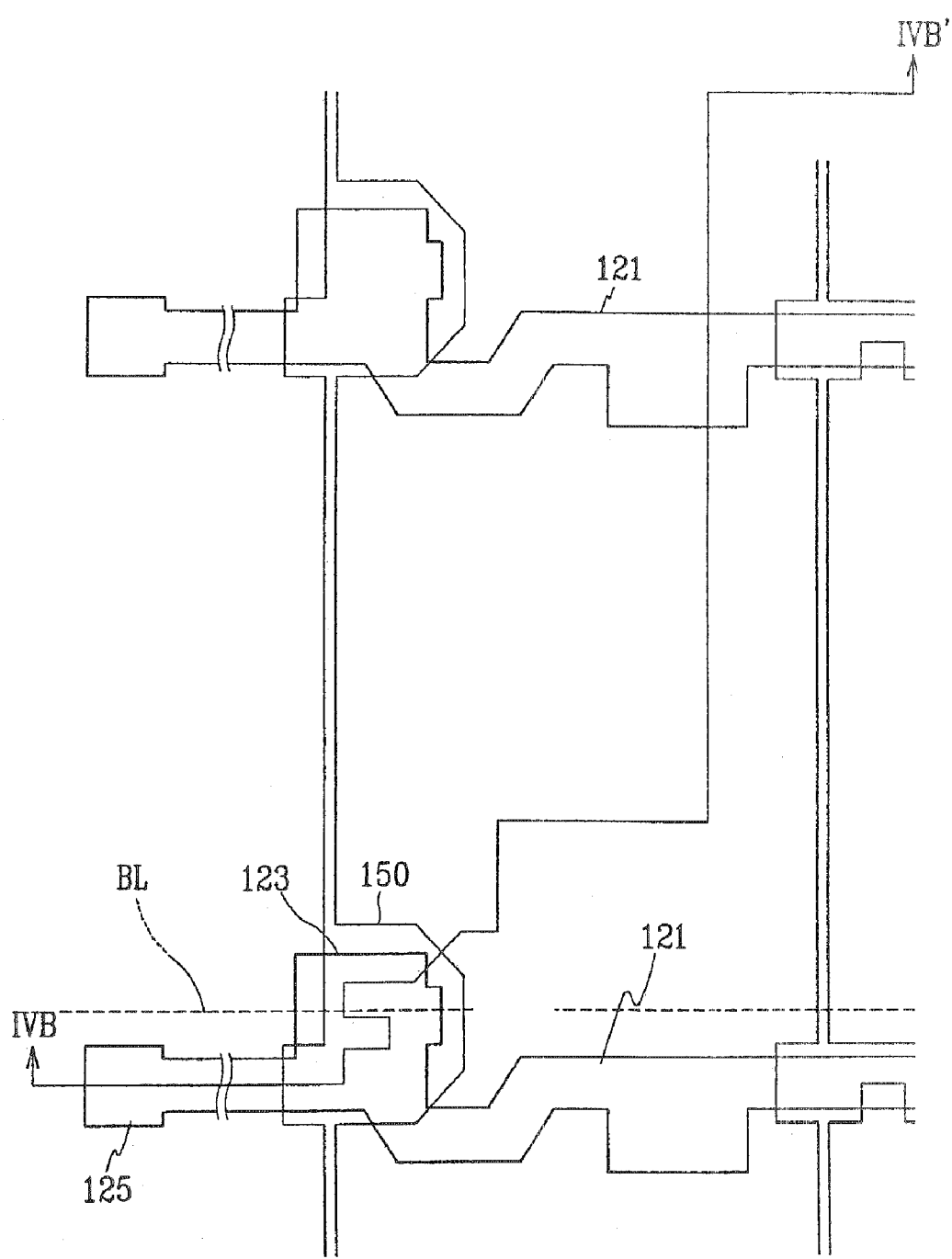
Figure 4B:
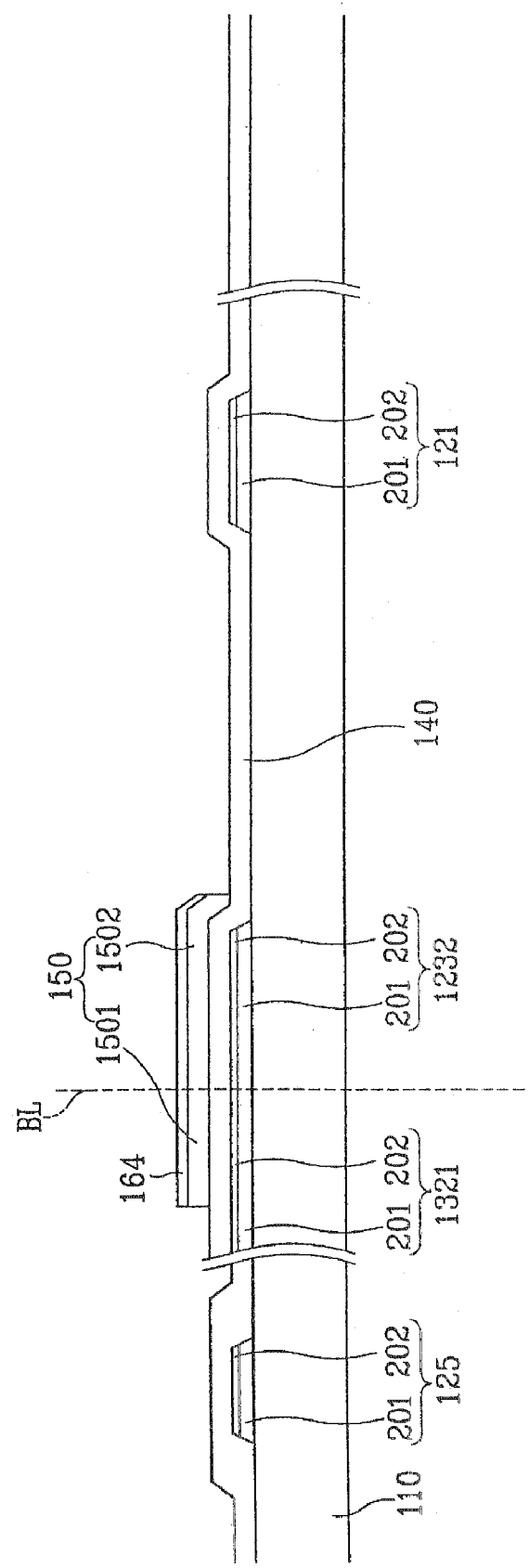

Referring to FIGS. 4A and 4B, after sequential deposition of a gate insulating layer 140, an intrinsic a-Si layer, and an extrinsic a-Si layer, the extrinsic a-Si layer and the intrinsic a-Si layer are patterned by using step and repeat divisional photolithography to form a plurality of extrinsic semiconductor stripes 168 and a plurality of intrinsic semiconductor stripes 150 on the gate insulating layer 140. Like the previous step, the boundary line BL of the shots in the divisional exposure extends substantially in the transverse direction.

Figure 5A:
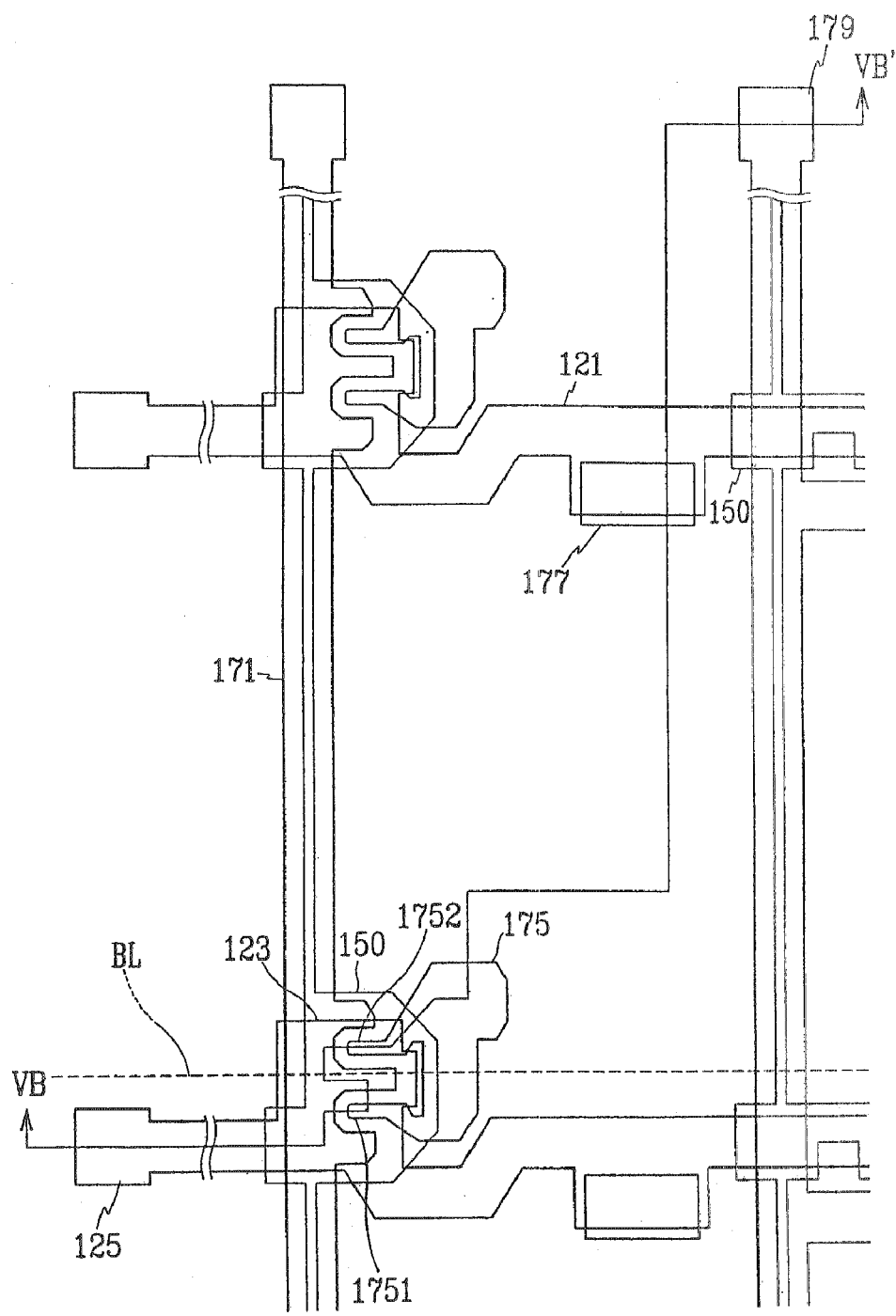

Referring to FIGS. 5A and 5B, a metal film is sputtered and photo-etched by using divisional exposure to form a plurality of data lines 171 including a plurality of source electrodes 173 with a plurality of branches 1731 and 1732 extending substantially in the transverse direction, a plurality of drain electrodes 175 including a plurality of projections 1751 and 1752 extending substantially in the transverse direction, and a plurality of storage capacitor conductors 177. Like the previous steps the boundary line BL of the shots in the divisional exposure extends substantially in the transverse direction such that it is parallel to the extension directions of the branches 1731 and 1732 and the projections 1751 and 1752. In addition, the boundary line BL is located on middle branches 1732 of the source electrodes 173.

Thereafter, portions of the extrinsic semiconductor stripes 168, which are not covered with the data lines 171, the drain electrodes 175, and the storage capacitor conductors 177, are removed to complete a plurality of ohmic contact stripes 1631 and 1632 including a plurality of projections and a plurality of ohmic contact islands 1651 and 1652 and to expose portions of the intrinsic semiconductor stripes 150. Oxygen plasma treatment preferably follows thereafter in order to stabilize the exposed surfaces of the semiconductor stripes 150.

Figure 6A:
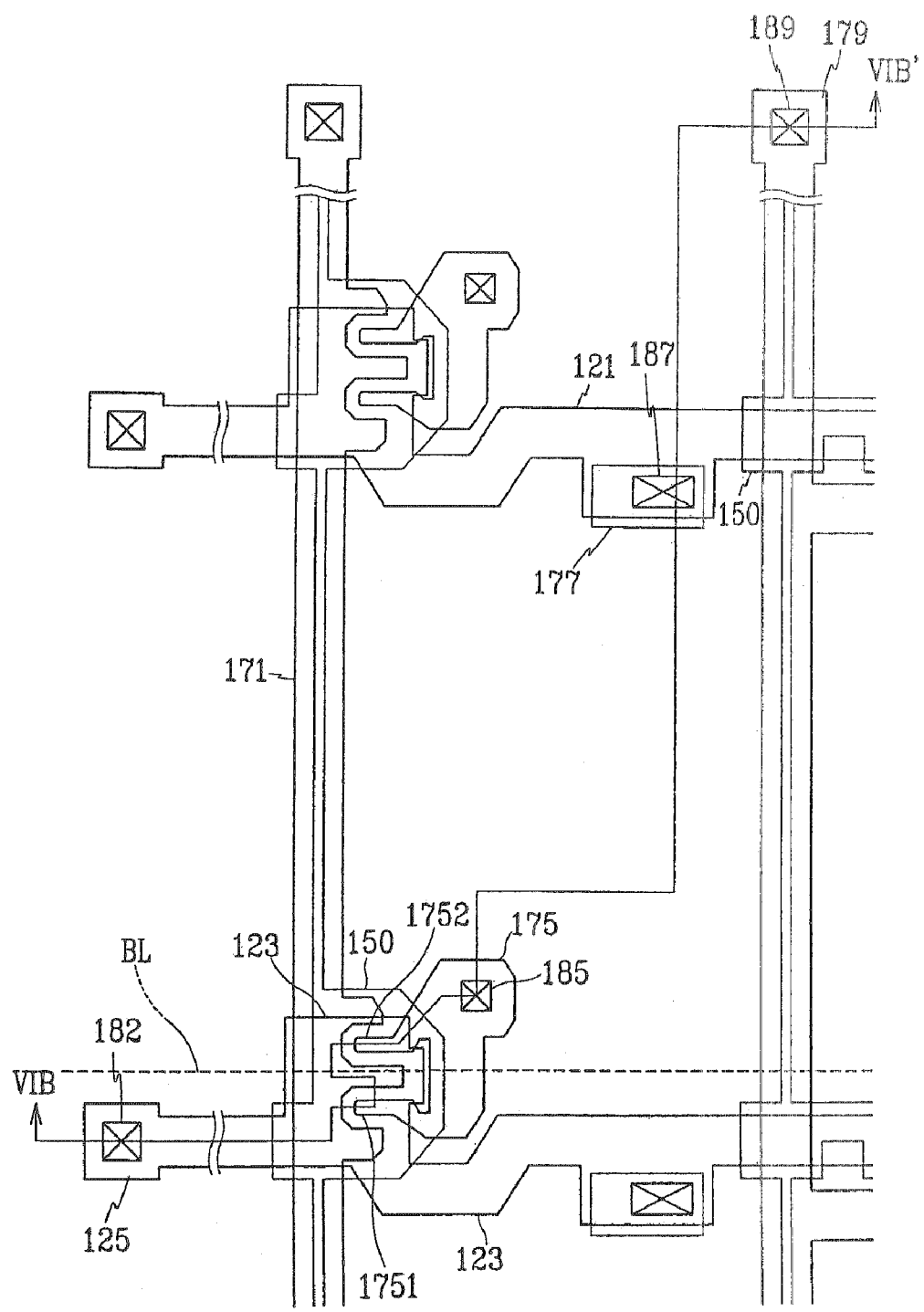
Figure 6B:
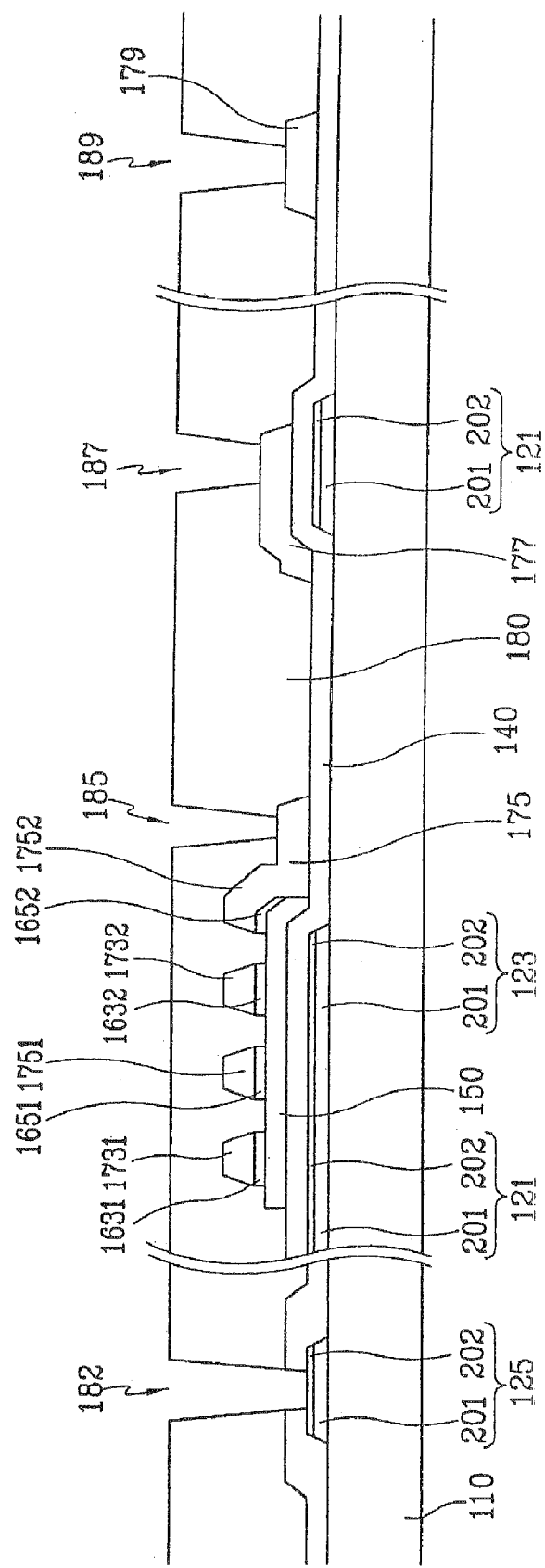

As shown in FIGS. 6A and 6B, after depositing a passivation layer 18O, the passivation layer 180 and the gate insulating layer 140 are dry-etched using photolithography to form a plurality of contact holes 182, 185, 187 and 189 exposing end portions 125 of the gate lines 121, the drain electrodes 175, the storage capacitor conductors 177, and end portions 179 of the data lines 171, respectively. When the gate lines 121, the drain electrodes 175, the storage capacitor conductors 177, and the data lines 171 have a multi-layered structure including Al, it is preferable not to expose Al in consideration of the contact with ITO or IZO.

Finally as shown in FIGS. 1 and 2, a plurality of pixel electrodes 190 and a plurality of contact assistants 92 and 97 are formed on the passivation layer 180 by sputtering and photo-etching an ITO or IZO layer with a thickness of about 900 Å. Like the previous steps, the boundary line BL of the shots in the divisional exposure extends substantially in the transverse direction.

As described above, all the boundary lines BL in the above-described steps extend substantially in the transverse direction such that they are parallel to the extension directions of the branches 1731 and 1732 and the projections 1751 and 1752. In addition, the boundary lines BL are located on middle branches 1732 of the source electrodes 173. Then, the twin TFTs are substantially symmetrical to the boundary lines BL and thus the deviation of the boundary lines BL between the shots, particularly in the longitudinal direction, may not make result in significant deviation of the parasitic capacitances between the conductive members such as the gate lines 121 including the gate electrodes 121, the data lines 171 including the source electrodes 173, the drain electrodes 175, and the pixel electrodes 190.

The twin TFT configuration may be partly applied to the TFT array panel. In particular, the twin TFTs are located near the boundaries BL between the shots.

A TFT array panel for an LCD according to another embodiment of the present invention will be described in detail with reference to FIGS. 7-9.

Figure 7:
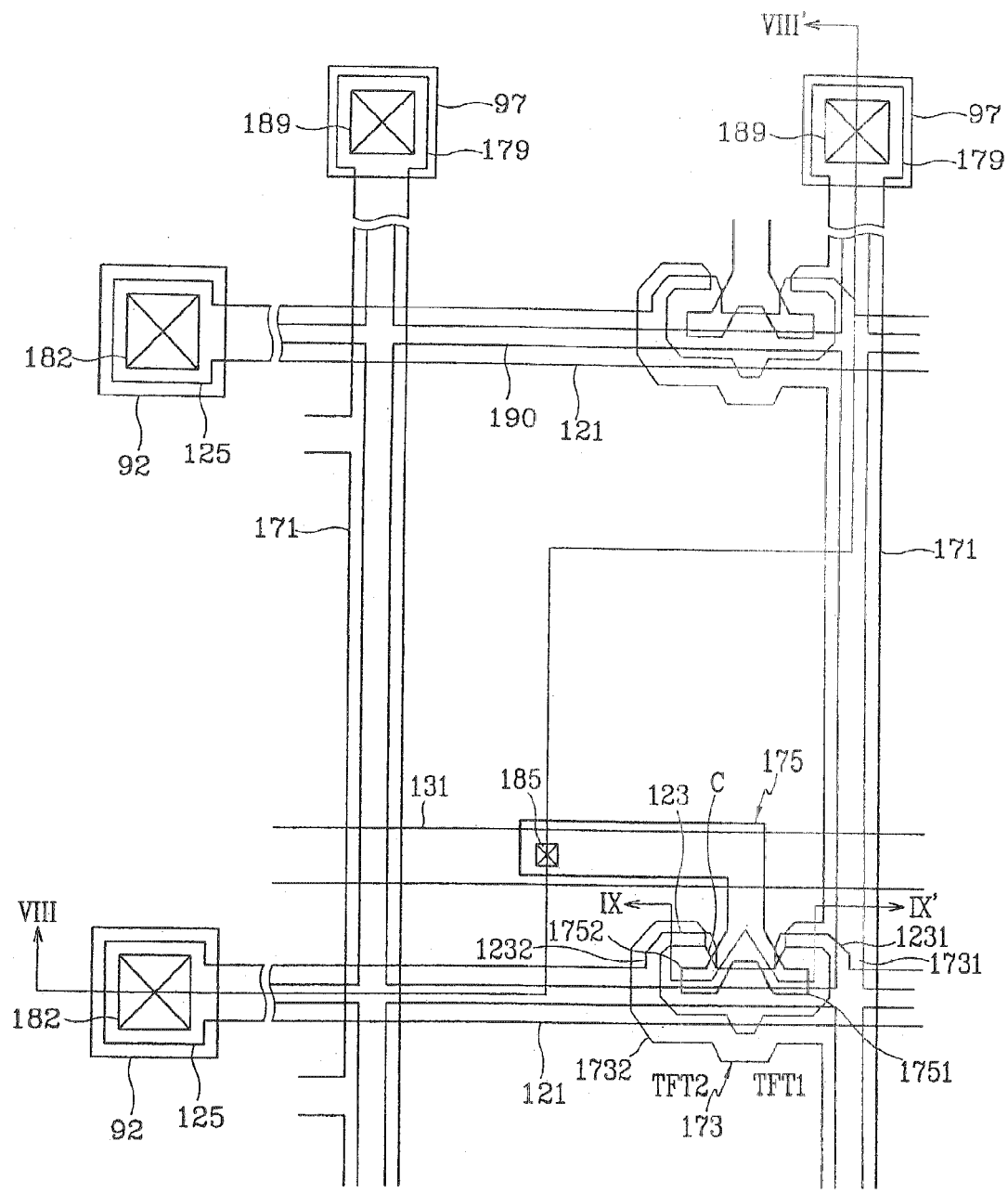
FIG. 7 is a layout view of an exemplary TFT array panel for an LCD according to another embodiment of the present invention.
Figure 8:
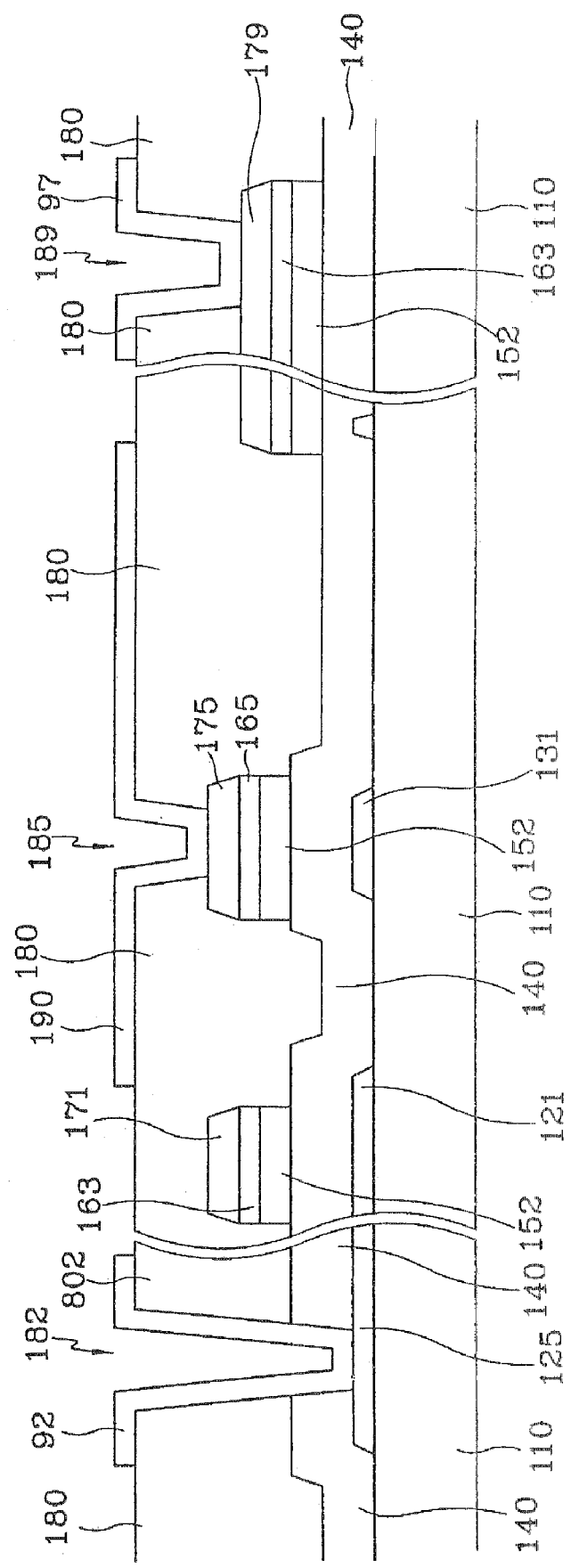
FIGS. 8 and 9 are sectional views of the TFT array panel shown in FIG. 7 taken along the lines VIII-VIII' and IX-IX', respectively.
Figure 9:
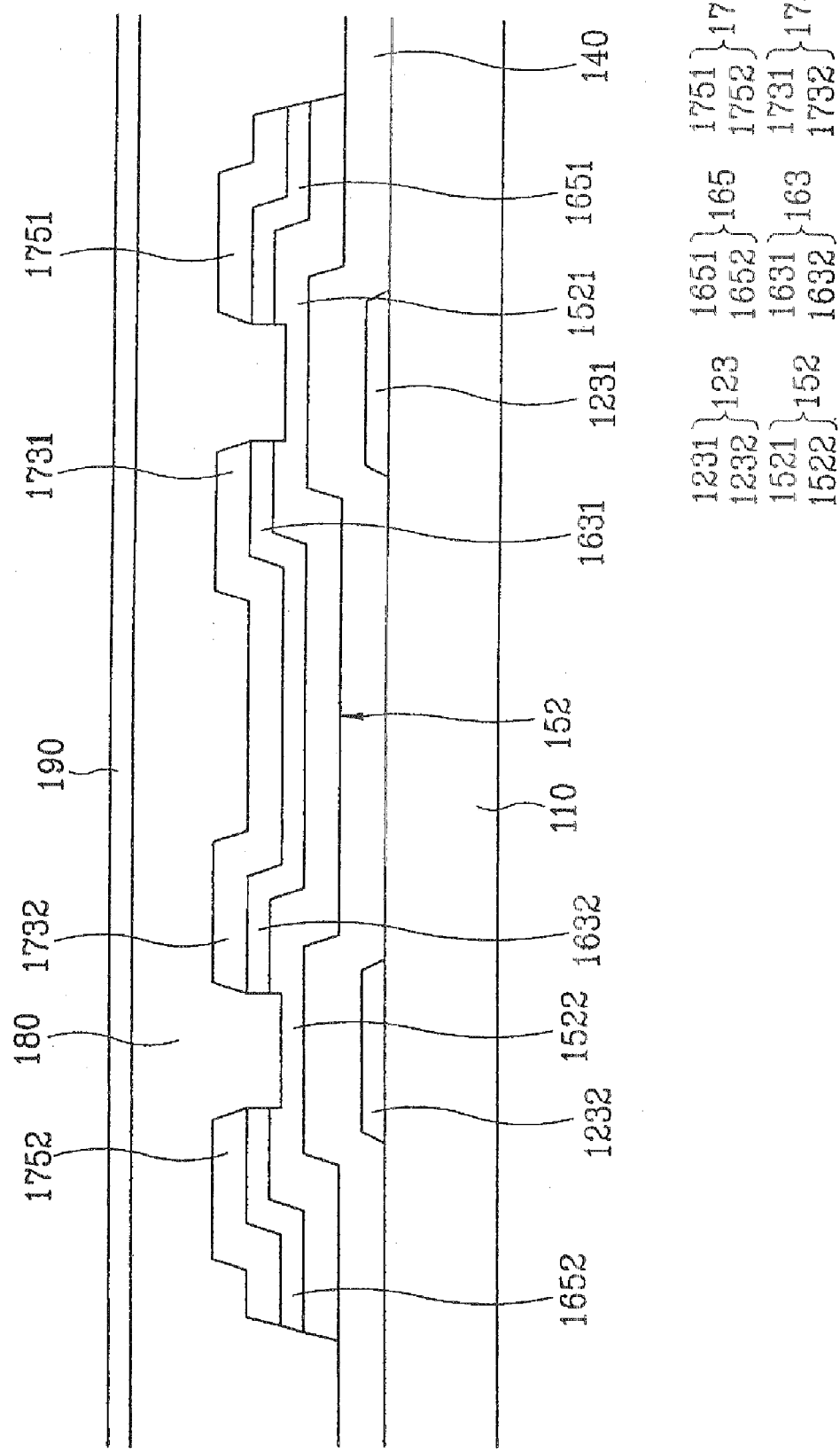

FIG. 7 is a layout view of an exemplary TFT array panel for an LCD according to another embodiment of the present invention, and FIGS. 8 and 9 are sectional views of the TFT array panel shown in FIG. 7 taken along the line VIII-VIII' and the line IX-IX', respectively.

As shown in FIGS. 7-9, a layered structure of a TFT array panel of an LCD according to this embodiment is almost the same as that shown in FIGS. 1 and 2. That is, a plurality of gate lines 121 including a plurality of gate electrodes 123 are formed on a substrate 110, and a gate insulating layer 140, a plurality of semiconductor stripes 152 including a plurality of projections, and a plurality of ohmic contact stripes 163 including a plurality of projections and a plurality of ohmic contact islands 165 are sequentially formed thereon. A plurality of data lines 171 including a plurality of source electrodes 173 and a plurality of drain electrodes 175 are formed on the ohmic contacts 163 and 165, and a passivation layer 180 is formed thereon. A plurality of contact holes 182, 185 and 189 are provided at the passivation layer 180 and/or the gate insulating layer 140, and a plurality of pixel electrodes 190 and a plurality of contact assistants 92 and 97 are formed on the passivation layer 180.

Different from the TFT array panel shown in FIGS. 1 and 2 the TFT array panel according to this embodiment provides a plurality of storage electrode lines 131, which are separated from the gate lines 121, on the same layer as the gate lines 121, and overlaps the storage electrode lines 131 with the drain electrodes 175 to form storage capacitors without expansions of the gate lines 121 and the storage capacitor conductors 177. The storage electrode lines 131 are supplied with a predetermined voltage such as the common voltage. The storage electrode lines 131 may be omitted if the storage capacitance generate by the overlapping of the gate lines 121 and the pixel electrodes 190 is sufficient.

In addition, the planar shapes of twin TFTs TFT1 and TFT2 are substantially symmetrical with respect to a longitudinal line. In detail, each source electrode 173 includes a pair of portions 1731 and 1732 forming a pair of parentheses and a connecting portion connecting the portions 1731 and 1732. Each drain electrode 175 has two projections extending toward the centers of the parentheses.

Furthermore, the gate lines 121 in this embodiment have a single-layered structure.

The semiconductor stripes 152 have almost the same planar shapes as the data lines 171 and the drain electrodes 175 as well as the underlying ohmic contacts 163 and 165, except for the projections where TFTs are provided. In detail, the semiconductor stripes 152 have substantially the same planar shape as the data lines 171 and the drain electrodes 175, except for portions located between the source electrodes 173 and the drain electrodes 175.

Now, a method of manufacturing the TFT array panel shown in FIGS. 7-9 according to an embodiment of the present invention will be described in detail with reference to FIGS. 10A-16C as well as FIGS. 7-9.

Figure 10A:
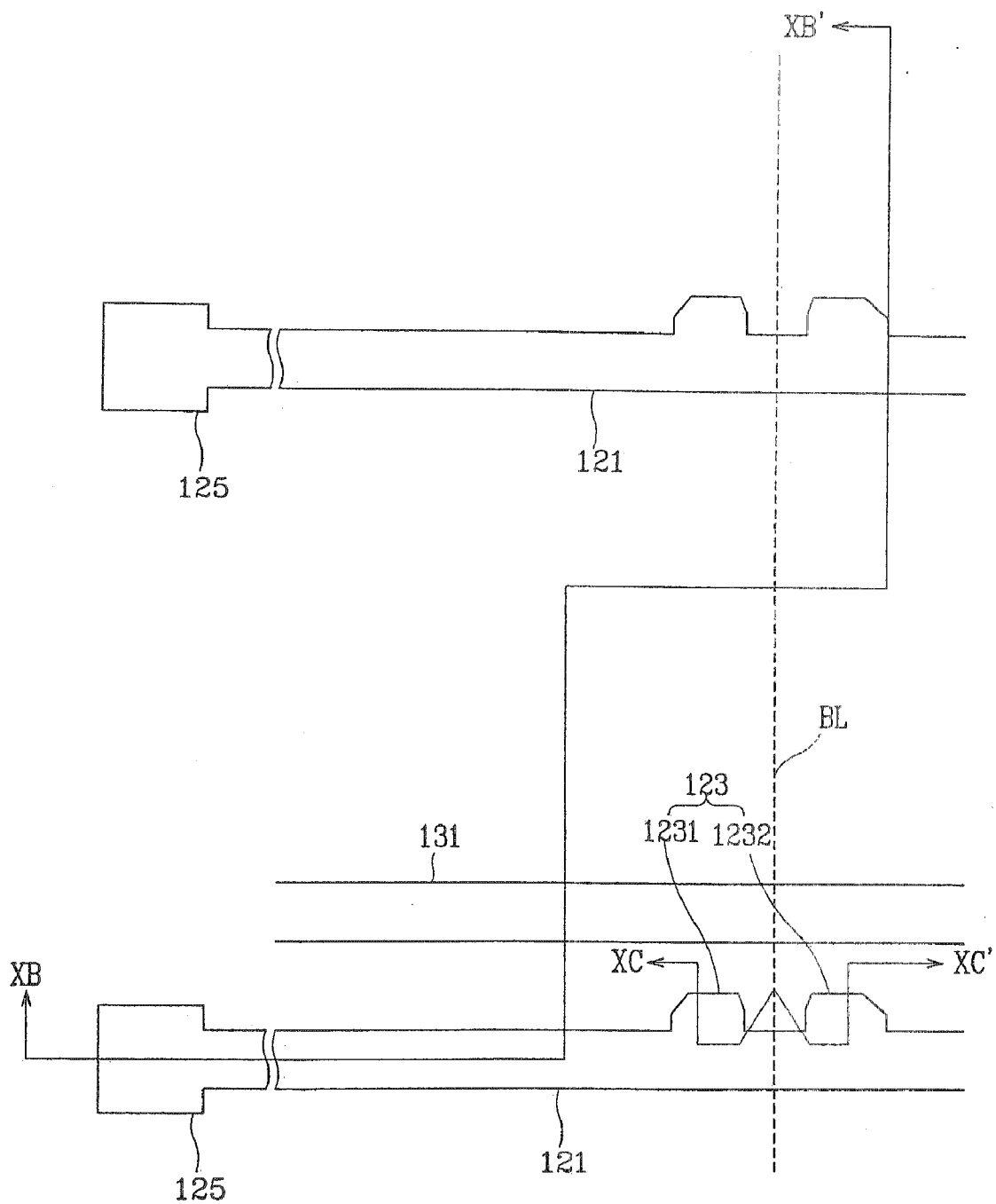
FIG. 10A is a layout view of a TFT array panel shown in FIGS. 7-9 in the first step of a manufacturing method thereof according to an embodiment of the present invention.
Figure 10B:
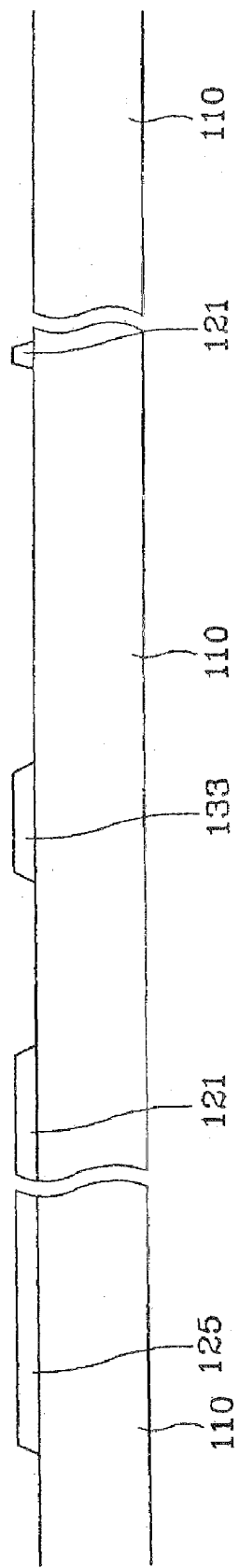
Figure 12A:
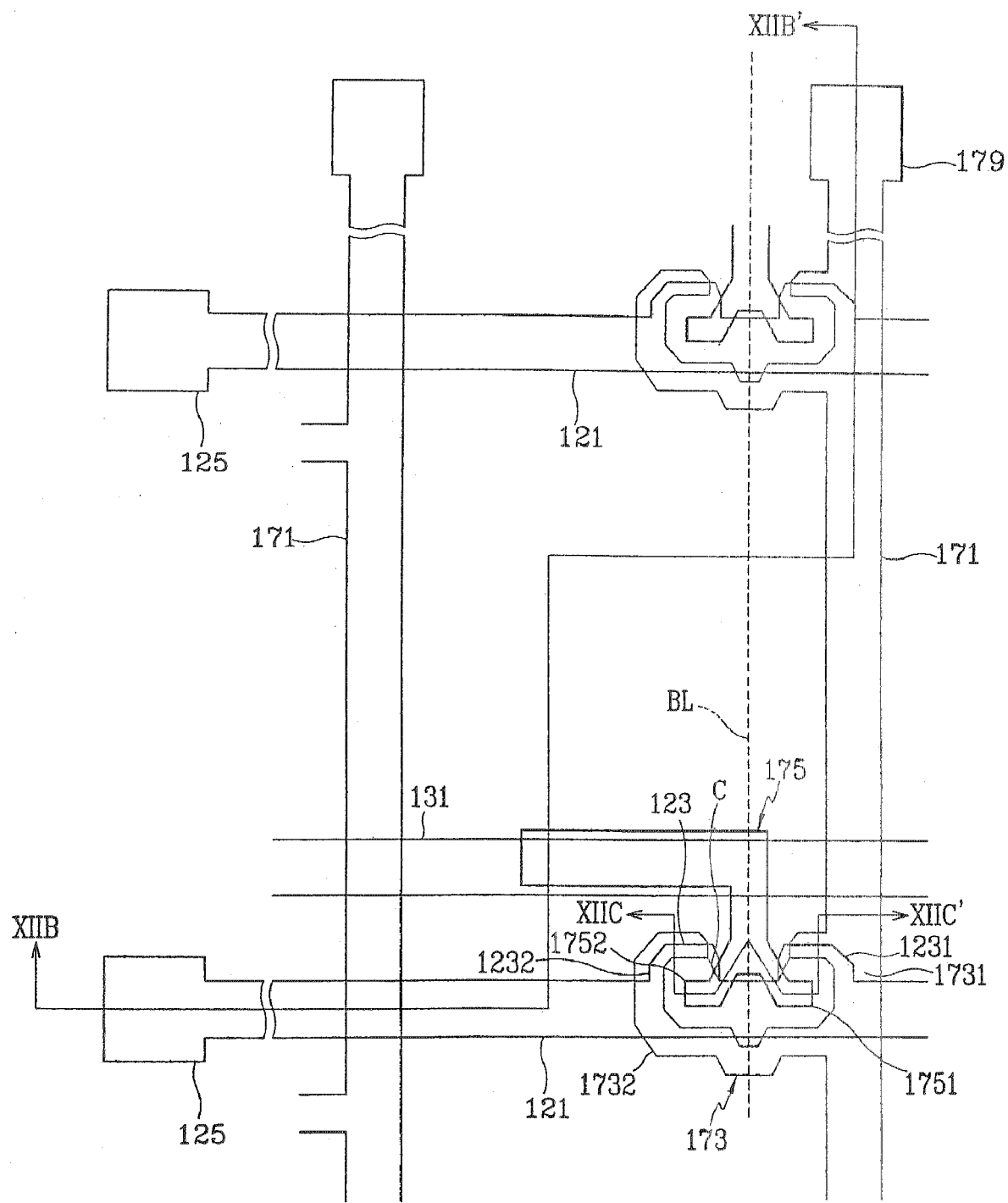
FIG. 12A is a layout view of the TFT panel in the step following the step shown in FIGS. 11A and 11B.
Figure 12B:
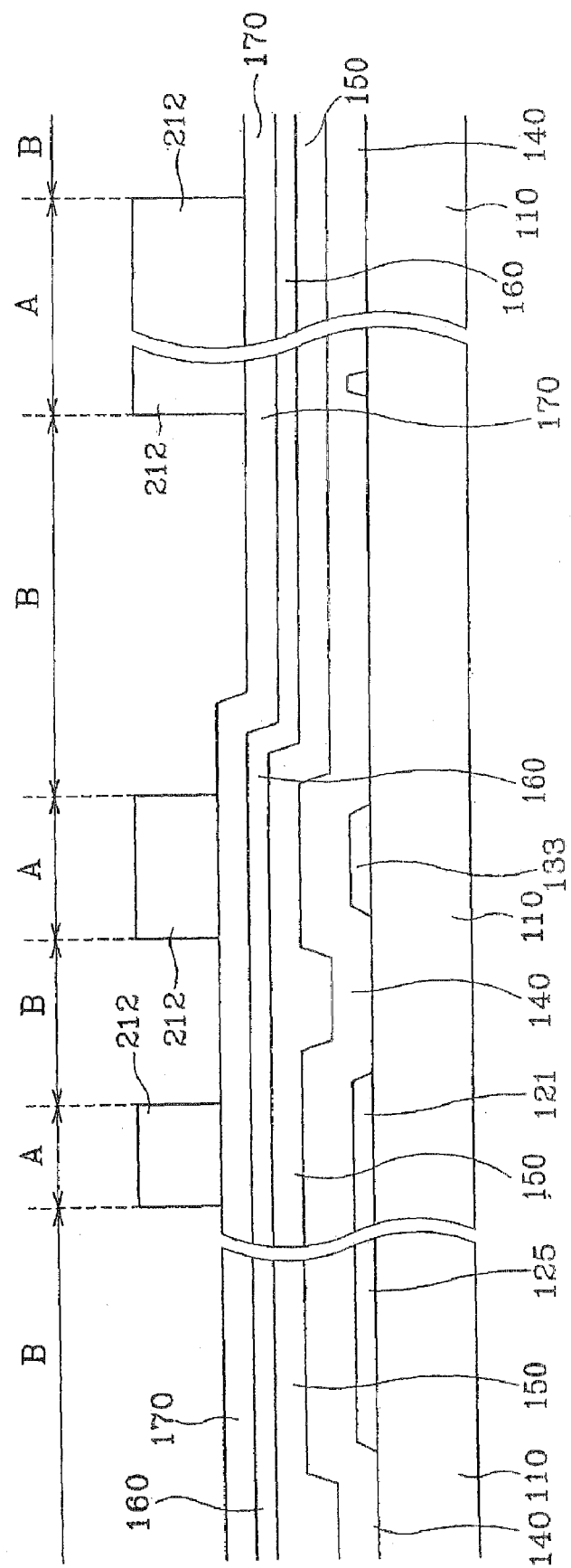

FIG. 10A is a layout view of a TFT array panel shown in FIGS. 7-9 in the first step of a manufacturing method thereof according to an embodiment of the present invention; FIG. 10B and 10C are sectional views of the TFT array panel shown in FIG. 10A taken along the lines XB-XB' and XC-XC', respectively; FIGS. 11 and 11B are sectional views of the TFT array panel shown in FIG. 10A taken along the lines XB-XB' and XC-XC', respectively, and illustrate the step following the step shown in FIGS. 10B and 1-C; FIG. 12A is a layout view of the TFT array panel in the step following the step shown in FIGS. 11A and 11B; FIGS. 12B and 12C are sectional views of the TFT array panel shown in FIG. 12A taken along the lines XIIB-XIIB' and XIIC-XIIC', respectively; FIGS. 13A, 14A and 15A and FIGS. 13B, 14C and 15B are respective sectional views of the TFT array panel shown in FIG. 12A taken along the lines XIIB-XIIB' and XIIC-XIIC', respectively, and illustrate the steps following the step shown in FIGS. 12B and 12C; FIG. 16A is a layout view of a TFT array panel in the step following the step shown in FIGS. 15A and 15B; and FIGS. 16B and 16C are sectional views of the TFT array panel shown in FIG. 16A taken along the lines XVIB-XVIB' and XVIC-XVIC', respectively.

Referring to FIGS. 10A-10C, a plurality of gate lines 121 including a plurality of gate electrodes 123 and a plurality of storage electrode lines 131 are formed on a substrate 110 by photo etching with division exposure.

As shown in FIGS. 11A and 11B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, and about 300-600 Å, respectively. A conductive layer 17O having a thickness of about 1,500 Å to 3,000 Å is deposited by sputtering, and a photoresist film 210 with the thickness of about 1-2 microns is coated on the conductive layer 170.

The photoresist film 210 is exposed to light through an exposure mask (not shown) by step and repeat process, and developed such that the developed photoresist has a position dependent thickness. The photoresist shown in FIGS. 12B and 12C includes a plurality of first to third portions with decreased thickness. The first portions 212 located on wire areas A and the second portions 214 located on channel areas C are indicated by reference numerals 212 and 214, respectively, and no reference numeral is assigned to the third portions located on remaining areas B since they have substantially zero thickness to expose and underlying portions of the conductive layer 170. The thickness ratio of the second portions 214 to the first portions 212 is adjusted depending upon the process conditions in the subsequent process steps. It is preferable that the thickness of the second portions 214 is equal to or less than half of the thickness of the first portions 212, and in particular, equal to or less than 4,000 Å.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist 212 and 214 enables to selectively etch the underlying layers when using suitable process conditions. Therefore, a plurality of data lines 171 including a plurality of source electrodes 173 and a plurality of drain electrodes 175 as well as a plurality of ohmic contact stripes 163 including a plurality of projections, a plurality of ohmic contact islands 165, and a plurality of semiconductor stripes 152 including a plurality of projections are obtained by a series of etching steps as shown in FIG. 12A.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas C are called second portions, and portions of the conductive layer 17, the extrinsic a-Si layer 160, and the intrinsic a-Si layer 150 on the remaining areas B are called third portions, An exemplary sequence of forming such a structure is as follows:

(1) Removal of third portions of the conductive layer 170, the extrinsic a-Si layer 1460 and the intrinsic a-Si layer 150 on the wire areas A;

(2) Removal of the second portions 214 of the photoresist;

(3) Removal of the second portions of the conductive layer 170 and the extrinsic a-Si layer 160 on the channel areas C; and (4) Removal of the first portions 212 of the photoresist.

Another exemplary sequence is as follows:

(1) Removal of the third portions of the conductive layer 170;

(2) Removal of the second portions 214 of the photoresist;

(3) Removal of the third portions of the extrinsic a-Si layer 160 and the intrinsic a-Si layer 150;

(4) Removal of the second portions of the conductive layer 170;

(5) Removal of the first portions 212 of the photoresist; and (6) Removal of the second portions of the extrinsic a-Si layer 160.

The first example is described in detail.

Figure 13A:
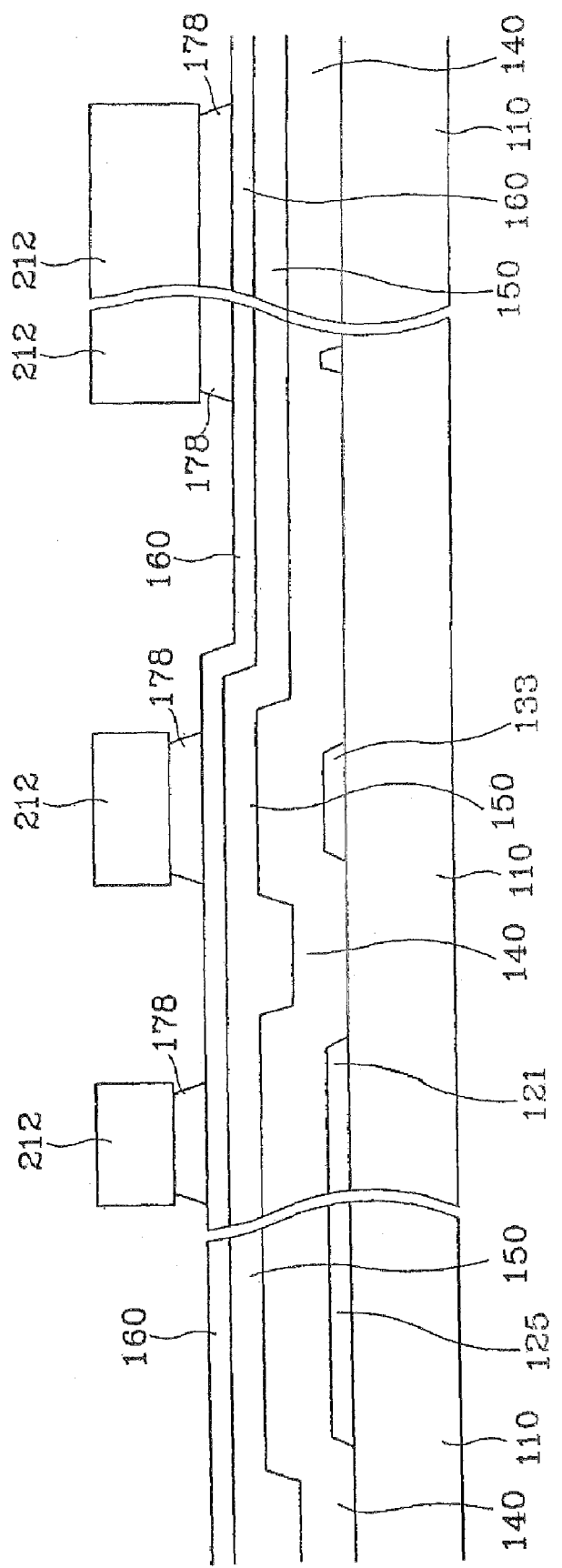
Figure 13B:
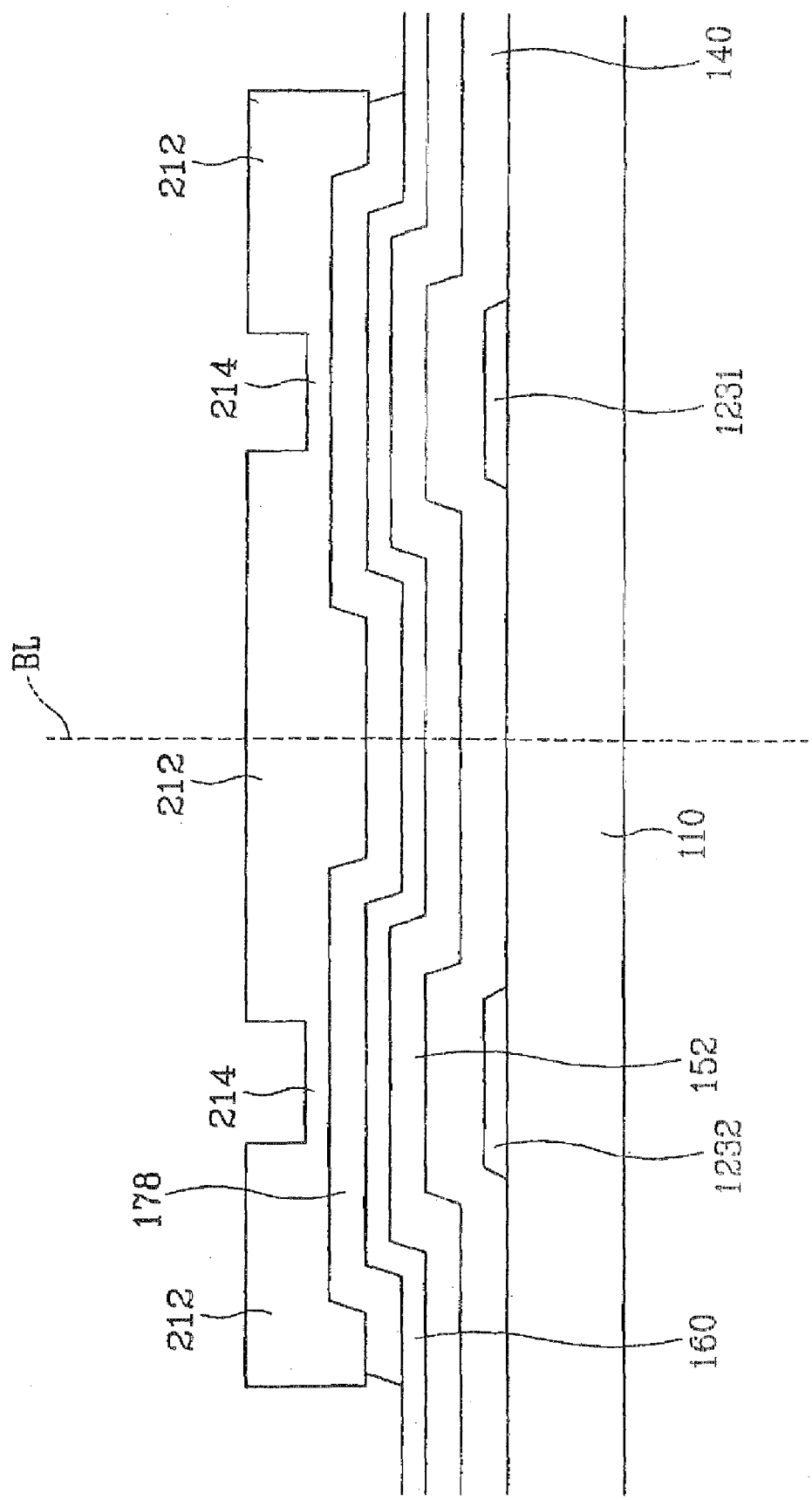

As shown in FIGS. 13A and 13B, the exposed third portions of the conductive layer 147 on the remaining areas B are removed by wet or dry etching to expose the underlying third portions of the extrinsic a-Si layer 160.

Reference numeral 178 indicates portions of the conductive layer 170 including the data lines 171 and the drain electrode 175 connected to each other. The dry etching may etch out the top portions of the photoresist 212 and 214.

Figure 14A:
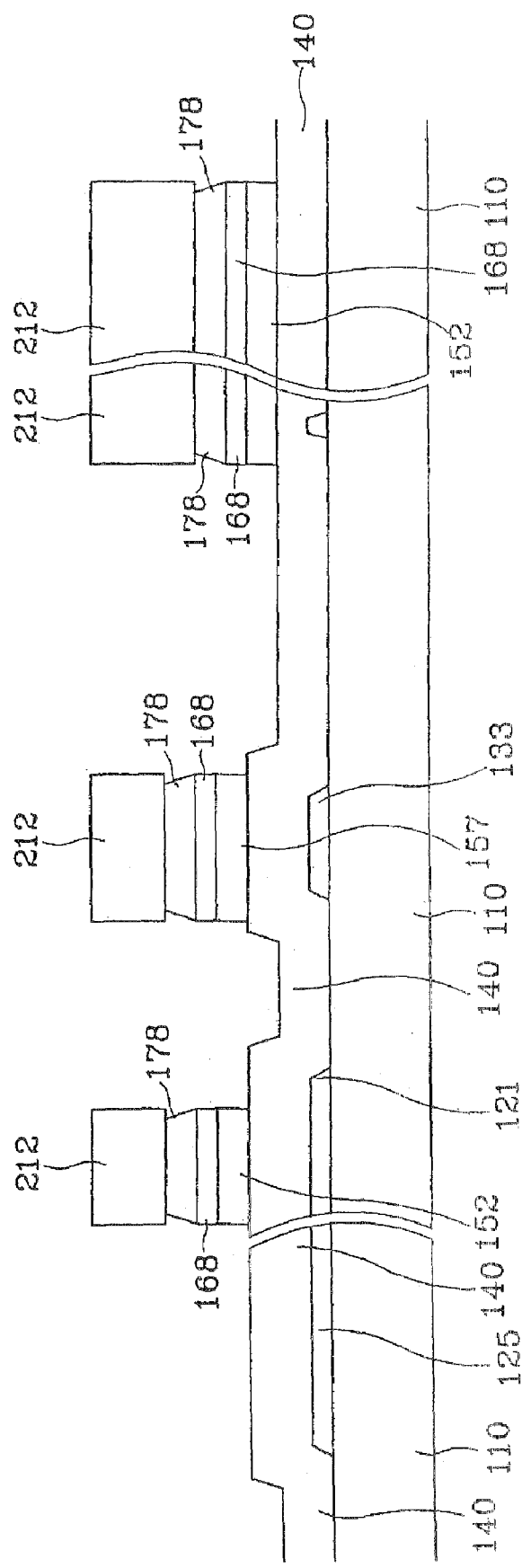
Figure 14B:
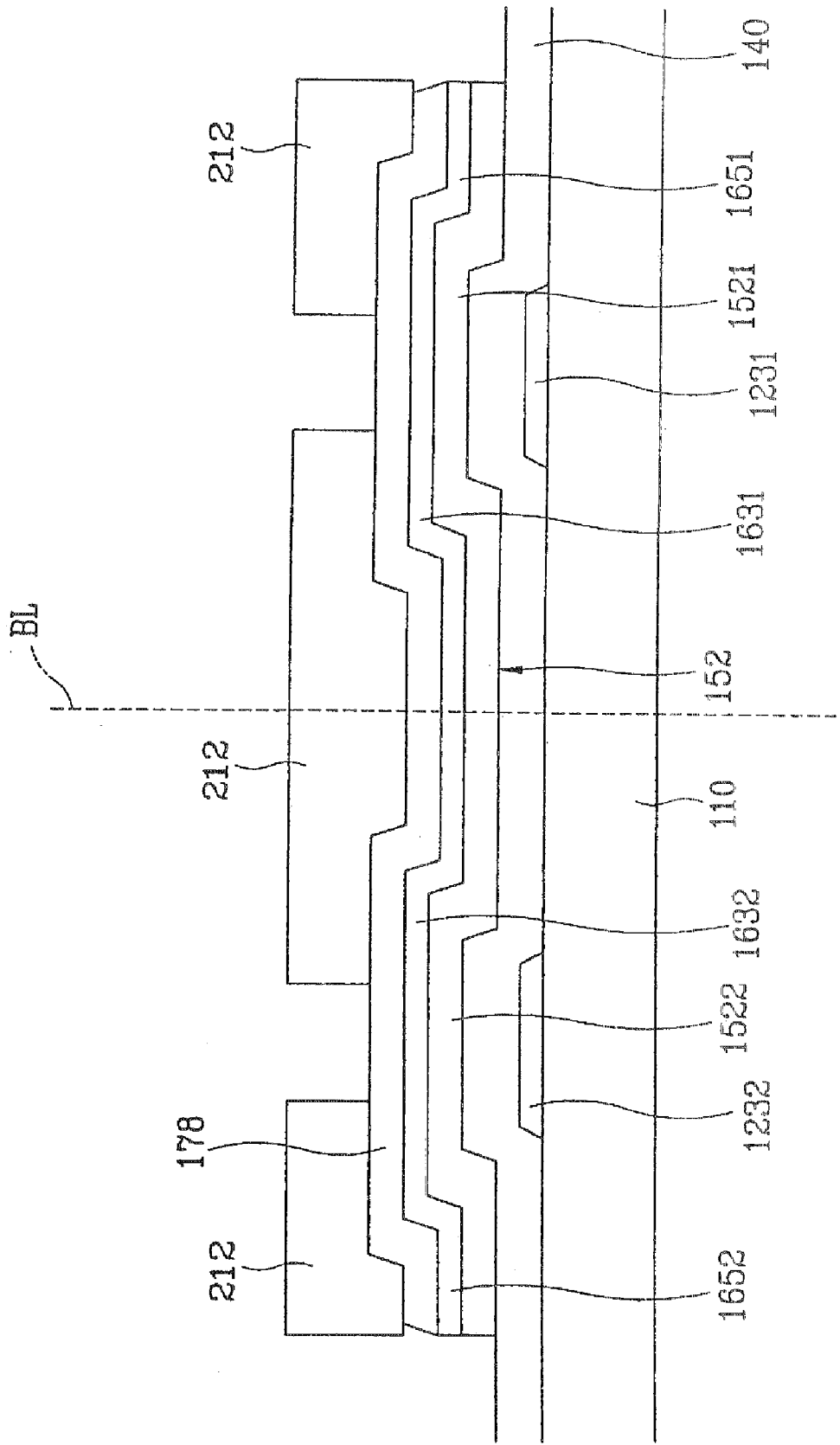

Referring to FIGS. 14A and 14B, the third portions of the extrinsic a-Si layer 160 on the areas B and of the intrinsic a-Si layer 150 are removed preferably by dry etching and the second portions 214 of the photoresist are removed to expose the second portions of the conductors 178. The removal of the second portions 214 of the photoresist are performed either simultaneously with or independent from the removal of the third portions of the extrinsic a-Si layer 160 and of the intrinsic a-Si layer 150. For example, a gas mixture of $SF_6$ and HCL or $SF_6$ and $O_2$, which has almost equal etching ratio for photoresist and amorphous silicon, is suitable for simultaneous etching of the second portions 214 of the photoresist and the third portions of the extrinsic a-Si layer 160 and of the intrinsic a-Si layer 150. Residue of the second portions 214 of the photoresist remained on the channel areas C is removed by ashing.

The semiconductor stripes 152 are completed in this step, and reference numeral 168 indicates portions of the extrinsic a-Si layer 160 including the ohmic contact stripes and islands 163 and 165 connected to each other, which are called "extrinsic semiconductor stripes."

Figure 15B:
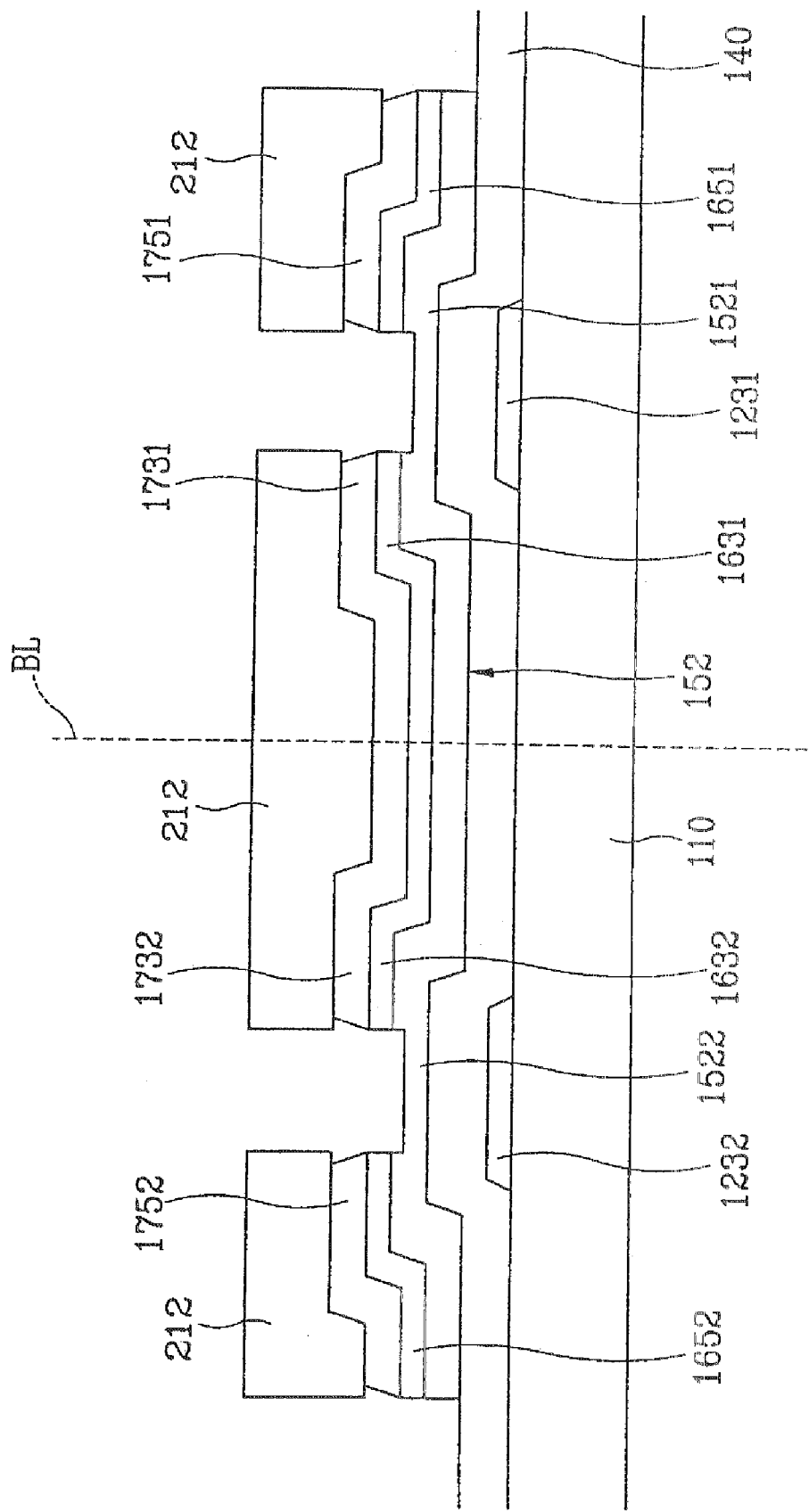
Figure 16A:
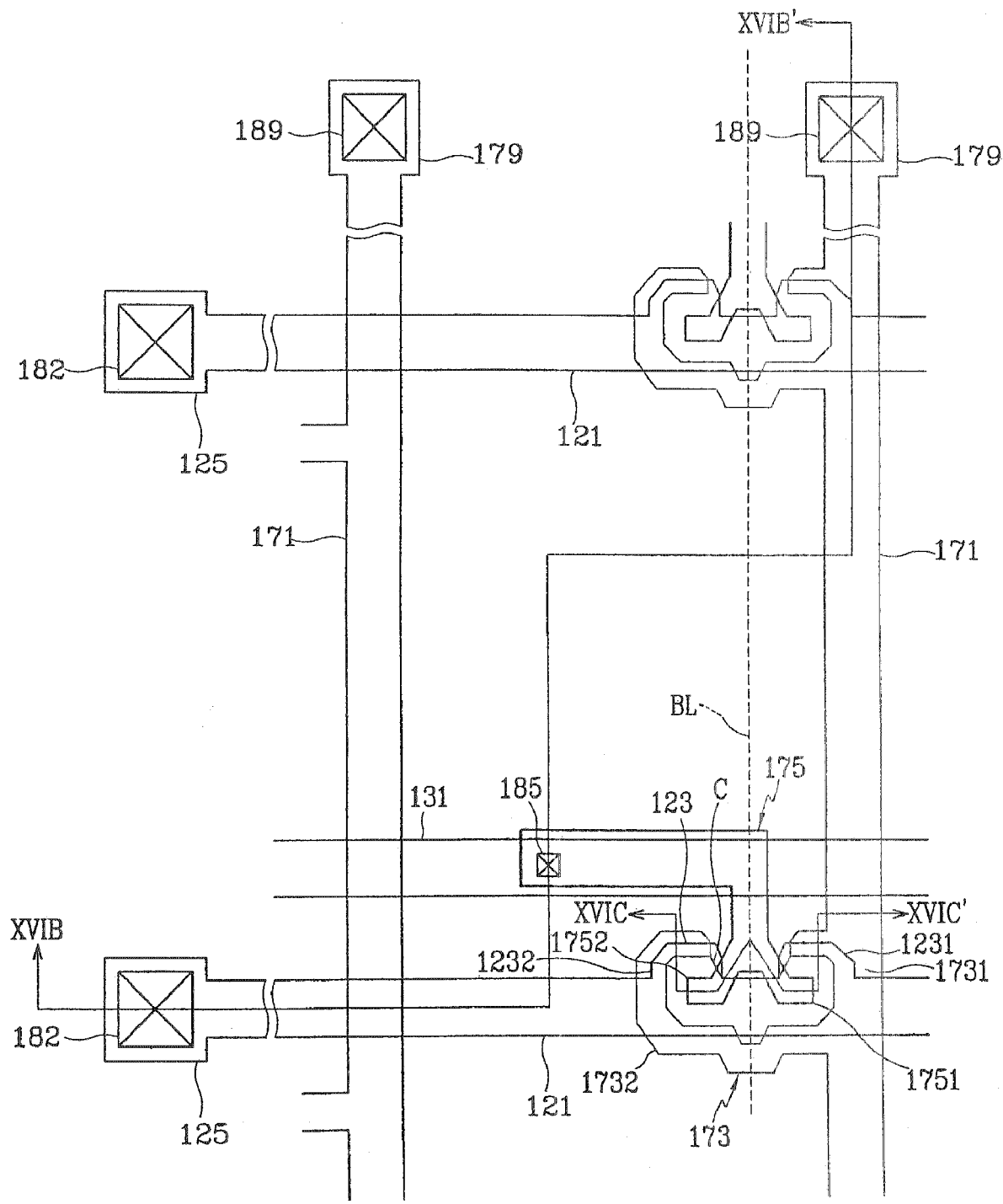
FIG. 16A is a layout view of a TFT array panel in the step following the step shown in FIGS. 15A and 15B.
Figure 16C:
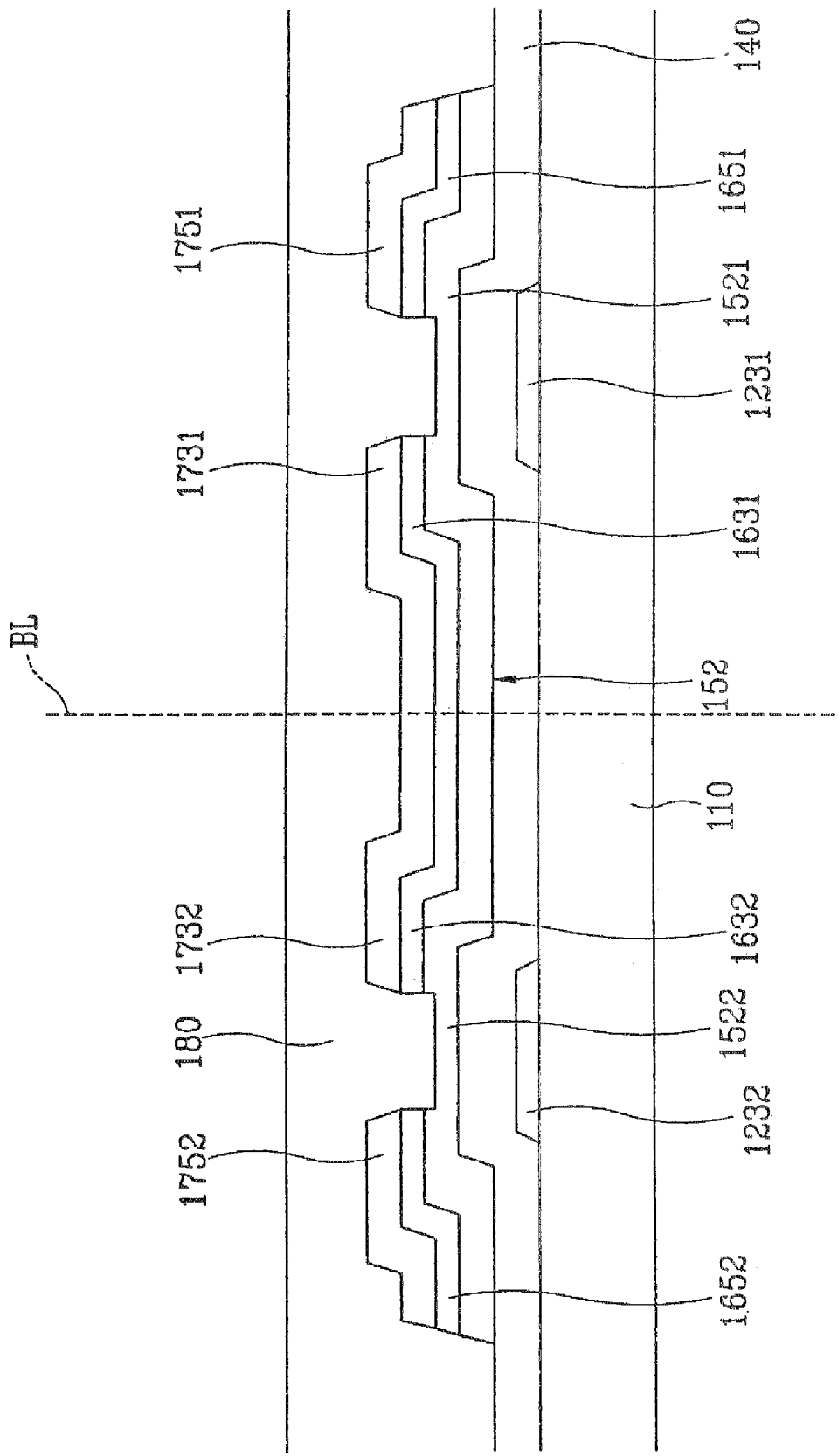

As shown in FIGS. 15A and 15B, the second portions of the conductors 78 and the extrinsic a-Si stripes 168 on the channel areas C as well as the first portion 212 of the photoresist are removed.

As shown in FIG. 15B, top portions of the projections of the intrinsic semiconductor stripes 152 on the channel areas C may be removed to cause thickness reduction, and the first portions 212 of the photoresist are etched to a predetermined thickness. A gas mixture including $CF_4$ and $O_2$ may enable to make remaining portions of the intrinsic semiconductor stripes 152 on the channel areas C have uniform thickness.

In this way, each conductor 178 is divided into a data line 171 and a plurality of drain electrodes 175 to be completed, and each extrinsic semiconductor stripe 168 is divided into an ohmic contact stripe 163 and a plurality of ohmic contact islands 165 to be completed.

Next, a passivation layer 180 is formed by chemical-vapor-depositing silicon nitride at a temperature in a range of about 250-1500° C., by growing low dielectric material such as a-Si;C:O or a-Si;O:F, by CVD of silicon nitride, or by coating an organic insulating material such as acryl-based material having a good planarization characteristic. Referring to FIG. 16A and 16B, the passivation layer 180 as well as the gate insulating layer 140 is photo-etched to form a plurality of contact holes 182, 185 and 189.

Finally, as shown in FIGS. 7-9, an ITO or IZO layer with a thickness in a range between about 500 Å and about 1,000 Å is sputtered and photo-etched with divisional light exposure to form a plurality of pixel electrodes 190 and a plurality of contact assistants 92 and 97.

The boundaries BL in each divisional light exposure extend in the longitudinal direction such that they pass through the center of the twin TFTs TFT1 and TFT2. Accordingly, the deviation of the boundary lines BL between the shots may not make result in significant deviation of the parasitic capacitances between the conductive members since the twin TFTs are substantially symmetrical to the boundary lines BL.

This embodiment simplifies the manufacturing process by forming the data lines 171 and the drain electrodes 175 as well as the ohmic contacts 163 and 165 and the semiconductor stripes 152 using a single photolithography step.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
  a gate electrode;
  a storage electrode;
  a gate insulating layer formed on the gate electrode and the storage electrode;
  a semiconductor member formed on the gate insulating layer;
  first and second source members connected to each other and located near the semiconductor member;
  first and second drain members located near the semiconductor member, and located opposite the first and the second source members, respectively;
  a storage capacitor conductor formed on the gate insulating layer and overlapping the storage electrode to form a storage capacitor along with the gate insulating layer interposed between the storage capacitor conductor and the storage electrode; and
  a pixel electrode connected to the first and the second drain members,
  wherein the gate electrode, the semiconductor member, the first source member, and the first drain member form a first thin film transistor, and the gate electrode, the semiconductor member, the second source member, and the second drain member form a second thin film transistor.

2. The then film transistor array panel of claim 1, wherein the first thin film transistor and the second thin film transistor are symmetrically aligned.

3. The thin film transistor array panel of claim 2, wherein the alignment of the first and the second film transistors are symmetrical with respect to a predetermined line.

4. The thin film transistor array panel of claim 3, wherein the predetermined line includes a boundary line between shots in light exposure.

5. The thin film transistor array panel of claim 4, further comprising a third thin film transistor different from the first and the second thin film transistors.

6. The thin film transistor array panel of claim 1, wherein the alignment of the first and the second thin film transistors are located opposite each other with respect to a boundary line between shots in light exposure.

7. The thin film transistor array panel of claim 1, wherein channels of the first and the second thin film transistors have curved shapes.

8. The thin film transistor array panel of claim 7, wherein channels of the first and the second thin film transistors have U or C shapes.

9. The thin film transistor array panel of claim 1, wherein the first and the second semiconductor members have substantially the same planar shapes as the first and the second source and drain members except for channel portions of the first and the second thin film transistors.

10. The thin film transistor array panel of claim 1, wherein the storage electrode is formed on the same layer as the gate electrode.

11. The thin film transistor array panel of claim 10, wherein the storage electrode is connected the gate electrode.

12. The thin film transistor array panel of claim 1, wherein the storage conductor electrode is formed on the same layer as the drain members.

13. The thin film transistor array panel of claim 12, wherein the storage capacitor conductor is connected to the drain members.

14. The thin film transistor array panel of claim 1, further comprising an organic insulating layer formed between the first and second source members, first and second drain members, and the storage capacitor conductor, and the pixel electrode.

15. The thin film transistor array panel of claim 1, wherein the gate electrode has a double-layered structure including two films having a different physical characteristics.

16. The thin film transistor array panel of claim 1, wherein the first and second source members, and first and second drain members have a multi-layered structure including at least two films having different physical characteristics.

* * * * *